(12) United States Patent
Wolff et al.

(10) Patent No.: US 11,938,979 B2
(45) Date of Patent: Mar. 26, 2024

(54) COOLING SYSTEM FOR A VEHICLE

(71) Applicant: Transportation IP Holdings, LLC, Norwalk, CT (US)

(72) Inventors: Jeffrey John Wolff, Erie, PA (US); Henry Todd Young, Erie, PA (US); Kevin Michael Jones, Erie, PA (US); Laura Cooper, Erie, PA (US)

(73) Assignee: Transportation IP Holdings, LLC, Norwalk, CT (US)

( * ) Notice: Subject to any disclaimer, the term of this patent is extended or adjusted under 35 U.S.C. 154(b) by 1132 days.

(21) Appl. No.: 16/720,327

(22) Filed: Dec. 19, 2019

(65) Prior Publication Data
US 2020/0223459 A1   Jul. 16, 2020

Related U.S. Application Data

(60) Provisional application No. 62/792,236, filed on Jan. 14, 2019.

(51) Int. Cl.
| | |
|---|---|
| *H02K 15/00* | (2006.01) |
| *B61C 17/04* | (2006.01) |
| *B61L 15/00* | (2006.01) |
| *H02K 9/00* | (2006.01) |
| *H01C 1/082* | (2006.01) |
| *H05K 7/20* | (2006.01) |

(52) U.S. Cl.
CPC .......... *B61L 15/0058* (2024.01); *B61C 17/04* (2013.01); *H02K 9/00* (2013.01); *B60L 2240/36* (2013.01); *H01C 1/082* (2013.01); *H02K 2209/00* (2013.01); *H05K 7/20945* (2013.01)

(58) Field of Classification Search
CPC ...... B60L 2240/36; B61C 17/04; B61L 3/006; H02K 9/00; H02K 2209/00; H05K 7/20945
USPC .................................. 310/16, 52, 54, 64, 71
See application file for complete search history.

(56) References Cited

U.S. PATENT DOCUMENTS

| | | | |
|---|---|---|---|
| 4,009,825 A * | 3/1977 | Coon ................. | G05D 23/1934 236/1 E |
| 9,889,746 B2 | 2/2018 | Wolff et al. | |
| 2005/0276020 A1* | 12/2005 | Ahmad ................... | H02P 29/40 361/698 |
| 2010/0066280 A1* | 3/2010 | Marchand ............... | B60L 50/61 318/380 |
| 2012/0062155 A1* | 3/2012 | Wang ....................... | H02P 3/22 318/471 |
| 2013/0075170 A1* | 3/2013 | Minoshima ............ | B60K 11/00 903/902 |
| 2014/0021898 A1* | 1/2014 | Hendrickson ......... | H02P 29/028 318/434 |

(Continued)

*Primary Examiner* — Rashad H Johnson
(74) *Attorney, Agent, or Firm* — The Small Patent Law Group LLC; Christopher R. Carroll

(57) ABSTRACT

An assembly may be provided that includes a controller configured to be coupled with at least one blower drive that operates a blower motor to cool resistive elements that dissipate electrical power as heat. The controller may be configured to determine whether the electrical power is no longer received by the resistive elements and operate the at least one blower drive to operate the blower motor to cool the resistive elements responsive to the electrical power no longer being received by the resistive elements.

20 Claims, 9 Drawing Sheets

(56) References Cited

U.S. PATENT DOCUMENTS

| | | | |
|---|---|---|---|
| 2015/0042248 A1* | 2/2015 | Nikolov | B61C 5/02 |
| | | | 318/473 |
| 2016/0101699 A1* | 4/2016 | Wolff | B60W 20/15 |
| | | | 290/31 |
| 2017/0072813 A1* | 3/2017 | Martin | B60L 53/00 |
| 2018/0141565 A1 | 5/2018 | Petrak et al. | |
| 2020/0094685 A1* | 3/2020 | Chen | B60L 50/60 |
| 2022/0056832 A1* | 2/2022 | Uppole | F01P 7/08 |

* cited by examiner

COOLING SYSTEM FOR A VEHICLE

CROSS-REFERENCE TO RELATED APPLICATIONS

This application claims priority to U.S. Provisional Application No. 62/792,236, which was filed on 14 Jan. 2019, and the entire disclosure of which is incorporated herein by reference.

BACKGROUND

Technical Field

The inventive subject matter described herein relates to a cooling system for a vehicle.

Discussion of Art

For large vehicles, such as rail vehicles, to provide dynamic braking of the engine, electrical power may need to be dissipated. As a result, grid assemblies are provided that include numerous resistive elements that couple to electric generating systems such as the traction motors responsible for propelling the vehicle.

To facilitate the dissipation of this energy into heat, materials are chosen for both the resistive elements and the substrate, or board, that receives the resistive element to handle the resulting heat generated by the power input. To facilitate cooling of the grid, a blower system is utilized to convey cooling air across the resistive elements on the board to supplement and enhance cooling of the grid.

Once electric power is no longer being received within the grid, the blower system stops conveying the cooling air across the resistive elements, thus conserving energy within the system. The resistive elements retain and dissipate heat even after the electric power is no longer conveyed to the resistive element. While the resistive elements have a designed thermal rating for temperatures of over 600° Celsius, typically the substrate that contains the resistive element has a designed thermal rating for approximately 200° C. As heat dissipates from the resistive elements into the ambient air, the heat also dissipates into the board. This is referred to as a heat soak, causing the board to increase in temperature even after electrical power is no longer being receiving by the grid assembly. This can include increasing to temperatures above the designed thermal rating of the board, causing unnecessary wear on the board, and resulting is reduction of life of the grid assembly.

BRIEF DESCRIPTION

In accordance with one example, an assembly may be provided that may include a controller configured to be coupled with at least one blower drive that operates a blower motor to cool resistive elements that dissipate electrical power as heat. The controller may be configured to determine whether the electrical power is no longer received by the resistive elements and operate the at least one blower drive to operate the blower motor to cool the resistive elements responsive to the electrical power no longer being received by the resistive elements.

In accordance with another example, a method may be provided that may include receiving electrical power from an electrical bus at resistive elements of a grid assembly and operating a blower drive while receiving the electrical power at the resistive elements from the electrical bus. The blower drive may be operated after the electrical power is no longer received by the resistive elements to cool the resistive elements. The blower drive may also cease operation after the electrical power is no longer received by the resistive elements.

In accordance with one example, a system may be provided that may include a controller configured to determine an accumulated wear parameter value for a grid assembly of a vehicle and an operating age indicative of a duration of use of the grid assembly. The controller may also be configured to update the accumulated wear parameter value based on operation of the grid assembly and determine an available wear parameter value for the grid assembly based on the accumulated wear parameter value and the operating age. The controller may also be configured to perform a first responsive action based on at least the available wear parameter value.

BRIEF DESCRIPTION OF THE DRAWINGS

The inventive subject matter may be understood from reading the following description of non-limiting embodiments, with reference to the attached drawings, wherein below.

DETAILED DESCRIPTION

Figure 1:
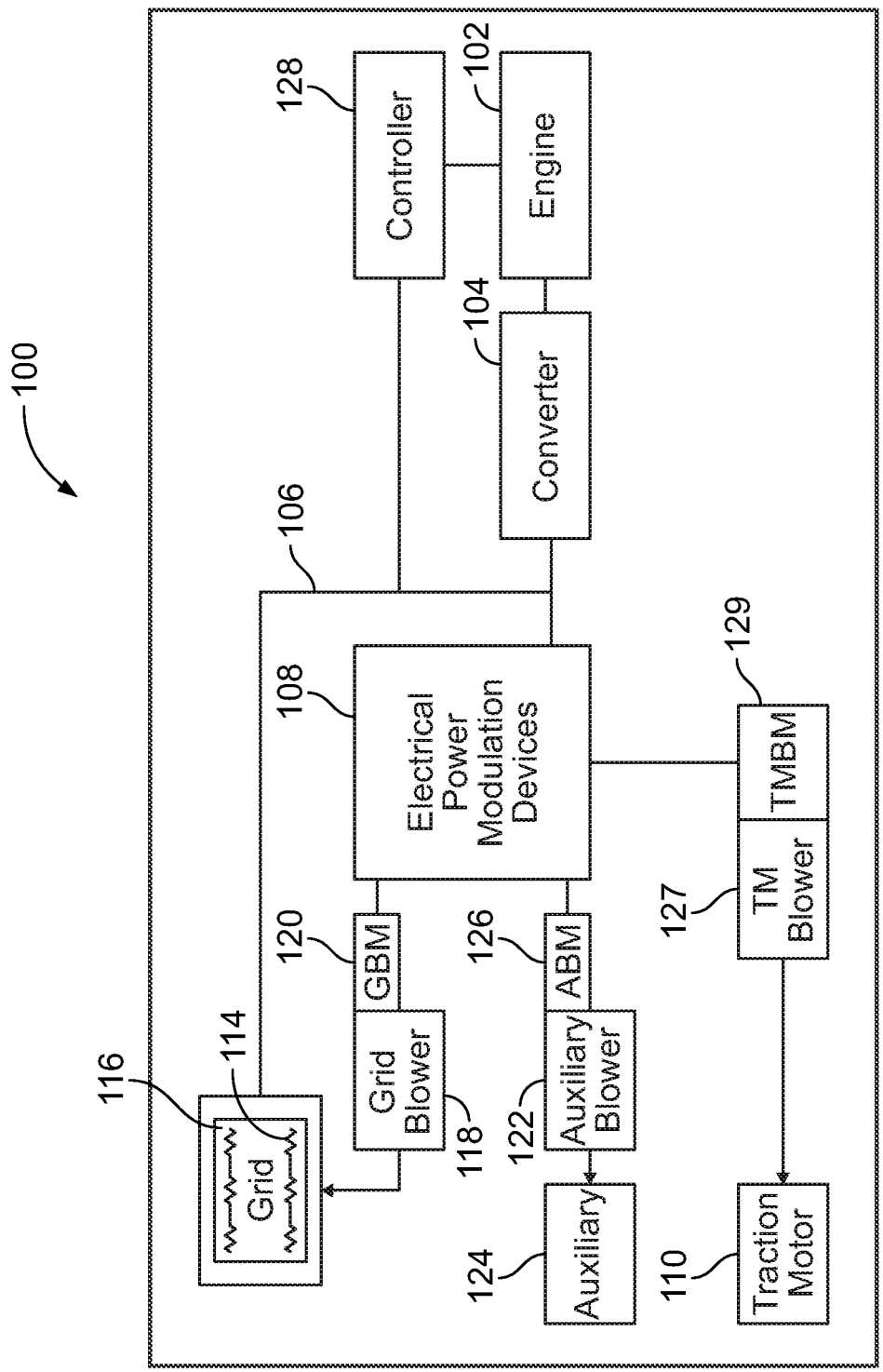
FIG. 1 is a schematic diagram of one example of a vehicle system.

Embodiments of the subject matter described herein relate to systems and methods for cooling a grid assembly with a blower assembly after power is no longer being received by the resistive elements in the grid. A controller may be coupled to resistive elements, individual fan blowers, and an electrical bus that supplies power to the grid assembly. The controller may be configured to operate the fan blowers to vary the speed of each fan blower while the electrical bus is providing power into the resistive elements. Similarly, after the electrical bus is no longer providing power to the resistive elements, the controller may be configured to continue to operate the fan blowers, including varying speed of each fan to continue cooling the resistive elements, the substrate, or the board to which the resistive elements are coupled even after power is no longer received from the electrical bus.

Determining the length of time and speed at which the fan blowers operate after the resistive elements stop receiving the power input from the electrical bus may be based on operational parameters of the grid assembly. In one example, the peak power being inputted into the grid assembly determines this period. In another example, a predetermined model or algorithm may be utilized to determine the amount of time and fan speed needed to achieve desired cooling. Alternatively, measurements are taken related to the grid assembly and such feedback may be utilized to determine if sufficient cooling of resistive elements has occurred. Measurements can include voltage, current, and/or resistance readings. In yet another example, direct thermal feedback may be utilized.

Optionally, changes in resistance over time may be determined or calculated by utilizing voltage and current determinations. These calculations may then be utilized to calculate temperature changes in resistive elements and whether cooling is still required. In yet another example, in addition or instead of methodologies related to using a model, or using feedback to determine when to end cooling, cooling may be simply ended after a predetermined period of time, or times out. In an example, a model methodology, or feedback methodology may be used to cease operation of blowers before such timing out, and if such model or feedback doesn't stop operation before the time out, then the blowers cease operation because of the time out instead of the model or feedback.

Additionally and alternatively, a pre-existing event can cause the blowers to stop cooling. In one example, when a vehicle requires an increased propel speed and all power needs to be diverted to propel the vehicle, the blowers may cease operation so that power utilized to power the motors of the blowers may be used for increased propel of the vehicle. In each instance, aftercooling, or cooling after power is no longer received from the electric bus, may be provided for a period of time and terminated. In each case, improved cooling for the resistive elements and board may be provided, reducing wear, and extending life of the components of the grid assembly.

FIG. 1 is a schematic diagram of a vehicle system 100 that in one example may be a locomotive vehicle system. The vehicle system includes an engine 102 that may be configured to generate a torque output that drives a converter 104. The converter produces electrical power that may be provided to various electrical components by an electrical bus 106. In one example, the converter may include one or more alternators that produce alternating current (AC) electrical power. Alternatively, the converter includes one or more rectifiers that produce direct current (DC) electrical power. Further, in some embodiments, the converter may include both one or more alternators and one or more rectifiers. Correspondingly, in other examples, the electrical bus may be a DC electrical bus. Further, in some embodiments, the electrical bus may be an AC electrical bus.

One or more electrical power modulation device(s) 108 receive electrical power from the electrical bus. The electrical power modulation device(s) are configured to modify the electrical power received from the electrical bus to a suitable form to be provided to electrical components of the vehicle system. In particular, the electrical power modulation device may be configured to modify a parameter of the electrical power such as voltage, current, frequency, or the like. In some embodiments, the electrical power modulation device may include an inverter. In one example, the inverter converts DC electrical power to AC electrical power, among other modifications. In some embodiments, the electrical power modulation device may include a converter. In one example, the converter modifies the voltage of DC electrical power from the DC electrical bus to a different voltage to supply the DC electrical power to a DC electrical component.

A traction motor 110 may receive electrical power from the electrical power modulation device(s) to provide tractive power to propel a vehicle. In one example the vehicle may be a locomotive. For simplicity, only one traction motor may be illustrated. However, it will be appreciated that a plurality of traction motors may provide tractive power to propel the vehicle using electrical power provided from the electrical bus.

In one example, when the vehicle system may be a locomotive vehicle system, the traction motor may be configured to act as a generator to provide dynamic braking to slow the locomotive. During dynamic braking, the traction motor may provide torque in a direction that may be opposite from the rolling direction of the locomotive which, in turn, generates electrical power that may be sent through the electrical bus to a grid 112 where the electrical power may flow across a plurality of resistive elements 114 located on a substrate 116, such as high temperature insulating material, to dissipate heat generated by the electric power. As a result, both the individual elements and the substrate must be designed to absorb, conduct, and dissipate the heat without degradation or malfunctioning. As an example, the resistive elements may be required to be made of a material that can conduct at least 600° C. while the substrate must be made of a material that can conduct at least 200° C. In one example the substrate may be made of a composite material that includes insulative material to enhance heat resistance properties of the substrate.

During operation of the vehicle system, the temperature of the grid may increase. Accordingly, in one example the grid may be force-air cooled. A grid blower 118 may blow air to cool the grid. The grid blower may be powered by a grid blower motor 120 that may be configured to receive electrical power from the electrical power modulation device(s) which modifies electrical power received from the electrical bus. It will be appreciated that vehicle system may include plural grid blowers to cool one or more resistive element grid(s).

Alternatively and additionally, other components of the vehicle system may be force-air cooled, and the control systems described herein may be utilized in controlling and operating such auxiliary blowers 122. Specifically, the control systems described herein are described in relation to the grid but may be applied for cooling other systems and devices within a vehicle system. As an example, the auxiliary blower may blow air to cool an auxiliary component 124. The auxiliary blower may be powered by an auxiliary blower motor 126 that may be configured to receive electrical power from the electrical power modulation device(s) which modifies electrical power received from the electrical bus. Similarly, the traction motor may include a traction motor blower 127 powered by a traction motor blower motor 129.

In some embodiments, the auxiliary component may receive electrical power from the electrical bus. For example, the auxiliary component may include a compression device configured to compress intake air, such as a supercharger or a turbocharger. However, the auxiliary component need not receive electrical power. For example, the auxiliary component 124 may include a radiator for cooling the engine. In some embodiments, the auxiliary blower may be used to cool intake air prior to entering a compression device to improve engine efficiency.

Vehicle system includes a controller 128 configured to control components of the locomotive vehicle system (e.g., engine, traction motor, blower drives, etc.). The controller includes one or more processor and electronic storage media for executing programs and storing calibration and control data. The controller similarly may include a transceiver that transmits and receives communication signals from remote devices such that the programs may be executed based on information received from a remote location, including from memory storage devices of other systems, the cloud, or the like. In this manner, the one or more processors are able to execute instructions to perform functions as required by the vehicle system. In one example, the one or more processors utilize control and/or vehicle data to create a model to predict the behavior or characteristic of a system within the vehicle system. In one example a model may be formed to predict or determine the temperature of the individual elements, board, sections of individual elements, portions of the board, etc. By utilizing such models to predict temperatures, the controller may operate one or more grid blowers in response to these predictions to efficiently provide needed cooling of the grid. Alternatively, the controller may monitor a current and/or temperature of an energy storage device, or bank, electrically couplable to the electric bus. Specifically, in an example, some of the electrical power can be directed to the energy storage device and some to the resistive elements by the controller. The blower can be activated by the controller when electricity may be supplied to the resistive elements, and the blower can be kept active by the controller while a temperature of the energy storage device may be above a threshold temperature regardless of whether the resistive element may be receiving the electrical power to dissipate as heat.

Additionally and alternatively, the controller may receive signals from sensors coupled to components of the vehicle system and may perform feedback and/or feedforward control based on the signals. Examples of signals that may be received by the controller include engine speed, motor speed, blower speed, engine temperature, motor temperature, grid temperature, ambient temperature, engine load, motor load, voltage, current, etc. Furthermore, the controller may be configured to vary grid blower speed based on various operating conditions by adjusting the state of electrical power modulation devices that provide electrical power to blower motors. For example, an electrical power modulation device may be controlled to raise/lower voltage, increase/decrease frequency, adjust phase, etc.

Figure 2:
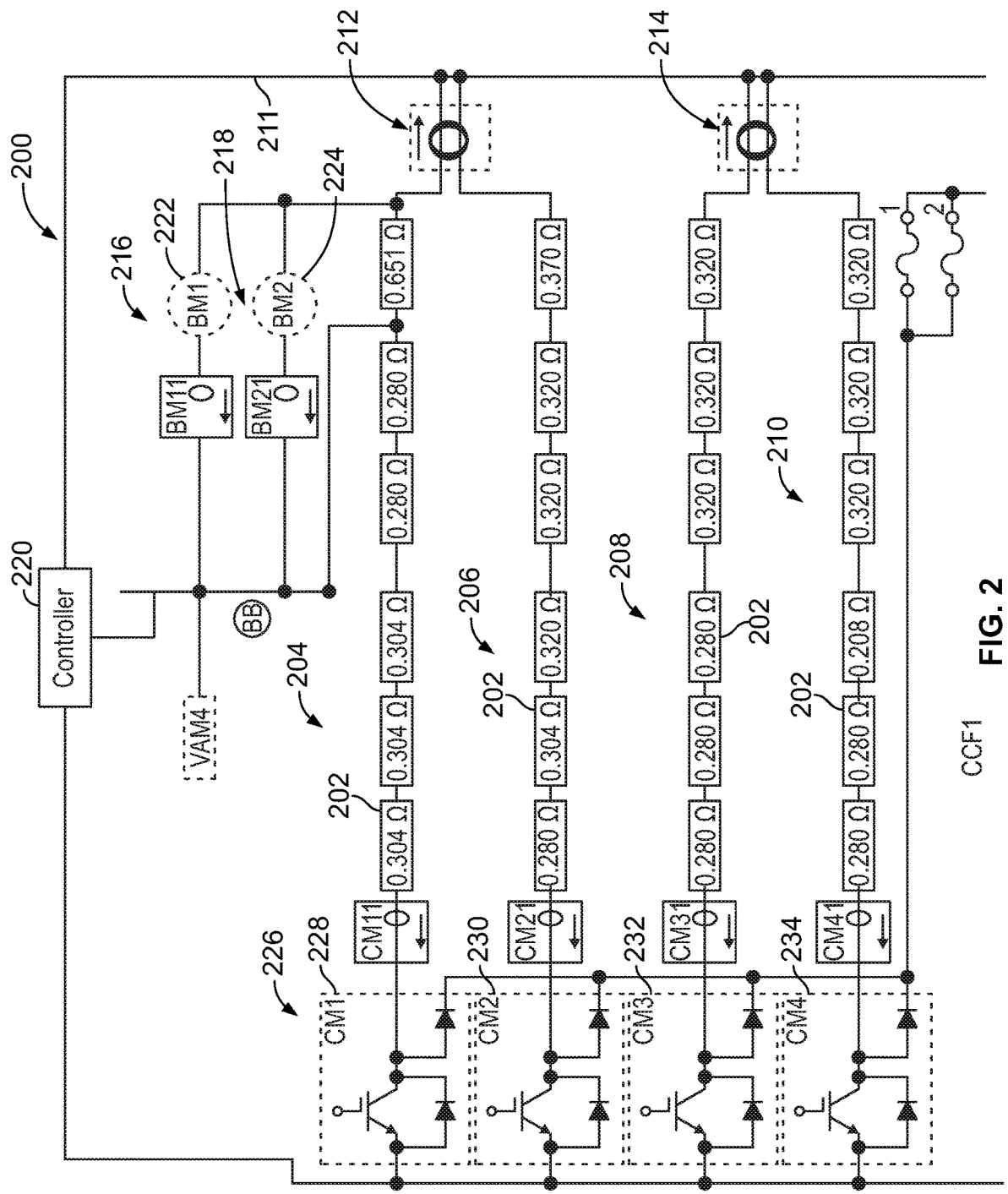
FIG. 2 is a circuit diagram of one example of a grid assembly.

FIG. 2 schematically shows one embodiment of a grid assembly 200. In one example the grid assembly includes the grid of FIG. 1. During dynamic braking, electrical power may be generated because of the traction motor generating torque to slow a vehicle. In one example the vehicle may be a locomotive. The generated electrical power may be transferred from the traction motor through the electrical bus to the resistive elements of the grid. Consequently, the temperature of the resistive elements of the grid may increase up to a temperature of approximately six hundred degrees Celsius or more, for example. A blower (not shown) may be operated to blow air at the grid assembly to aid in dissipation of the heat. Even after the traction motor stops operating, to avoid heat remaining within the elements from soaking into the substrate, or board, the blower continues to operate for a period of time after the generated electrical power may be transferred. While described in relation to a traction motor, the grid assembly 200 in other examples may receive power form other power systems.

The grid assembly in one example includes resistive elements 202 provided in a first string 204, second string 206, third string 208, and fourth string 210. Each string may include resistive elements provided in series connection. While in this example six resistive elements are provided in each string, in other examples, more or less resistive elements are utilized. The first and second strings are coupled to an electrical bus 211 of the vehicle at a first connector 212 while the third and fourth strings are coupled to the electrical bus of the vehicle at a second connector 214. Each string receives electrical power through the electrical bus as a result of braking to be dissipated as heat.

First and second blower drives 216, 218 are coupled to the strings, or legs, and electrically connected to a controller 220 for operating the blower motors during operation of the vehicle. The blower drives may include first and second blower motors 222, 224. In this example, the blower motors may be tapped off of individual string and controlled by a first switch element 228 of a switching system 226. Alternatively, in other embodiments, AC based blower drives that are controlled individually may be utilized instead of this tapping arrangement. In an alternative embodiment, instead of blower drives, a controller initiates the opening of a louver system to allow or facilitate an airflow across the resistive elements in addition to or in place of initiating the blower motor. Thus, the louver system may act to cool the resistive elements, or supplement cooling of the resistive elements.

In particular, in one example the first and second blower motors may be controlled to remain operational even after power may be no longer being conveyed through the electrical bus. In particular, even after power is no longer being conveyed through the electrical bus, the heat within resistive elements may need to fully dissipate. During this period heat continues being dissipated by the resistive elements and consequently soaked in or conveyed to the board. Consequently, the first and second motors may be operated by the controller to continue operating during this time, even though power is no longer being provided by the electric bus. The grid assembly illustrated may be an exemplary grid assembly. Other arrangement, connections, coupling or the like may be provided in other similar grid assemblies and still use the methodology described herein.

Alternatively, in one embodiment, the controller may be configured to determine that electrical power will be sent to the resistive elements and in advance of the electrical power by a defined period the controller initiates the first blower motor and/or the second blower motor so that at least one blower motor may be operating when the electricity may be received at the resistive elements. As a result, the resistive elements are immediately cooled as the resistive elements begin generating heat.

The blowers are powered by the grid blower drives that may include the blower motors that in one example are AC grid blower motors. Each blower motor may be coupled to an inverter that may be coupled to taps on the electrical bus. The inverter may be configured to provide variable frequency and/or variable voltage output to each blower motor. As a particular example, the inverter may be a DC to three phase inverter having three phase output. In one example, because the inverter may be directly connected to the electrical bus the grid blower motor may be powered by the entire voltage on the DC bus, if desired, to operate the grid blower at a high speed.

In one example, the grid blower motors may receive electrical power from the inverter rather than directly from across the resistors such that the speed of the grid blower may be decoupled from the electrical power on the grid. In other words, the speed of the grid blower may be operated and adjusted independent of the amount of electrical power on the grid. By enabling independent speed control of the grid blower motor, the acceleration and/or speed of the grid blower may be varied regardless of a voltage level on the grid of resistive elements. Accordingly, the grid blower speed may be controlled to enhance cooling of the grid which may extend the usable lifetime of the grid as well as increase the braking capability of the locomotive in such examples. In addition, the grid blower drives may continue to operate after voltage on the electrical bus ceases, allowing cooling after voltage is no longer present.

Furthermore, due to the variable speed control of the grid blower, under some conditions, the speed of the grid blower may be advantageously reduced or maintained at a substantially constant speed. For example, grid blower speed may be reduced to reduced inertial stress on impeller or fan blades of the grid blower to extend the useful lifetime of the grid blower. As another example, the speed of the grid blower may be reduced to reduce the audible noise level of the grid blower to a desired audible noise level. In contrast, a grid blower drive configured so that speed of the grid blower may be based on an amount of electrical power across the grid may be incapable of voluntarily reducing the speed of the grid blower. Grid blower control strategies for managing audible noise will be discussed in further detail below. Further, the speed of the grid blower may be maintained at a substantially constant speed even as electrical power on the grid or bus varies to reduce stress on the grid blower from centrifugal forces.

The grid assembly also includes a switching system 226. The switching system may include switching elements 228, 230, 232, and 234 that each electrically couple to a corresponding string 204, 206. In particular, a first switching element may be connected in series to the first string, the second switching element may be connected in series to the second string, the third switching element may be connected in series to the third string, and the fourth switching element may be coupled to the fourth string. In one example, the switching elements are choppers. In other examples the switch elements are IGBTs, contactors, or the like. In another example, the switching elements includes a switch that converts a DC input into a variable DC output. The switching system may be utilized to control operation of the blower drives, test individual resistive elements to ensure proper operation, or the like as will be describe in further detail herein.

FIGS. 3-7 illustrate example drive systems, or drives, that in one example are the drive systems illustrated in FIGS. 2-5 of U.S. Pat. No. 9,889,746 entitled System and Method for Reducing Fuel Consumption in a Vehicle, filed Dec. 18, 2015 that is incorporated herein in full. In one example the first and second blower drives of FIG. 2 may be one of the drive systems of FIGS. 3-7.

Figure 3:
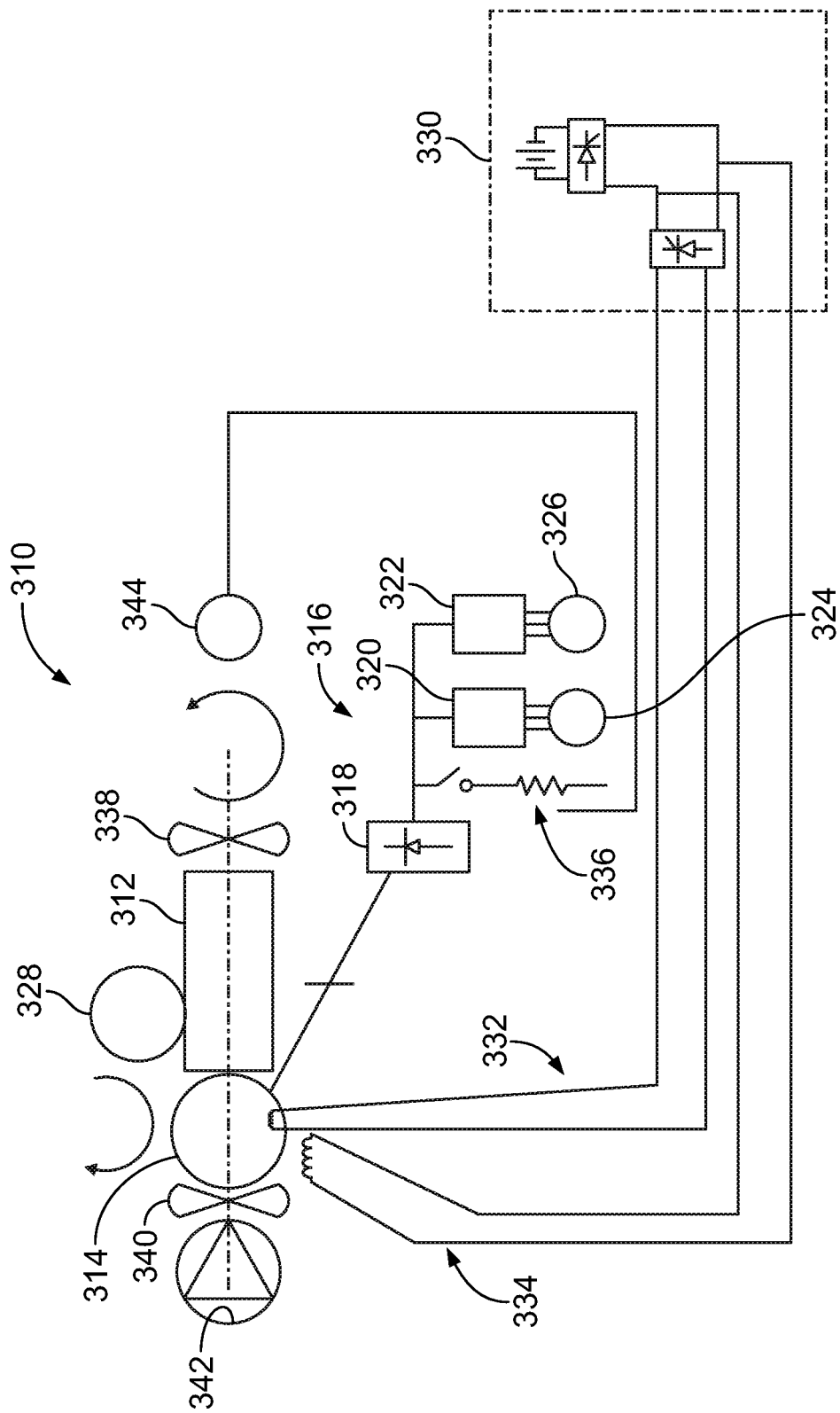
FIG. 3 is a schematic diagram of one example of a drive system.

FIG. 3 schematically illustrates an exemplary drive system 310 for an electric drive machine such as an OHV or other vehicle. The drive system includes a primary power source such as an engine 312 (e.g., a diesel engine, a gasoline engine, a multi-fuel engine, etc.) and a traction alternator/generator 314 mechanically coupled to and driven by the engine. As illustrated in FIG. 3, the traction alternator/generator may be electrically coupled to a traction bus 316. The alternator/generator may be configured to provide AC electric power to one or more rectifiers 318, which are electrically connected to one or more power converters, e.g., first and second inverters 320, 322, via the traction bus. The inverters may be connected to first and second traction motors 324, 326 associated with first and second wheels of the vehicle, respectively. The rectifier may be configured to convert the AC power received from the alternator/generator into a DC output which may be then fed to the inverters through the traction bus. The inverters may be configured to supply three-phase, variable frequency AC power to the first and second traction motors associated with the first and second wheels of the vehicle (typically the rear wheels of the vehicle). While the rectifier is illustrated as being separate from the traction alternator/generator, in certain embodiments, the rectifier may form a part of the alternator. In an embodiment, the traction bus may be 1000-1500 VDC bus.

As also shown in FIG. 3, in an embodiment, a starter motor 328 may be associated with the engine for rotating the engine to initiate operation. In addition, the vehicle may include a battery 330, e.g. a 24V battery, electrically coupled to the alternator/generator through a tertiary winding 332 and afield winding 334. The battery may be configured to function as an alternator field static exciter to initiate operation of the electric drive system of the vehicle.

The traction motors may provide the tractive power to move the vehicle and may be AC or DC electric motors. When using DC traction motors, the output of the alternator may be typically rectified to provide appropriate DC power. When using AC traction motors, the alternator output may be typically rectified to DC and thereafter inverted to three-phase AC before being supplied to the traction motors. During a propel mode of operation, power may be transferred from the engine to the traction motors, and thus to the wheels of the vehicle to effect movement.

In addition to providing motive power, the traction motors may also provide a braking force for controlling the speed of the vehicle on which the drive system may be deployed. This is commonly referred to as dynamic braking. During a dynamic braking mode of operation, such as when motion of the vehicle is to be retarded, power may be generated by the mechanical rotation of the drive wheels and directed toward a retarding grid 336. In particular, the kinetic energy of the vehicle may be converted into rotational power at the drive wheels. Rotation of the drive wheels may further rotate the motors to generate electrical power, for example, in the form of AC power. The inverters may serve as a bridge to convert the power supplied by the motors into DC power. Dissipation of the DC power generated by the motors may produce a counter-rotational torque at the drive wheels to decelerate the vehicle. Such dissipation may be accomplished by passing the generated current provided by the inverters through a resistance, such as the dynamic braking grid, or retarding grid, as shown. In one example the dynamic braking grid may be the grid assembly of FIG. 2.

As further illustrated in FIG. 3, the drive system also includes an engine radiator fan 338 driven by the engine to provide cooling for the engine. The system may also include one or more control and motor cooling fans 340 mechanically coupled to the alternator/generator. The cooling fan(s) may be configured to provide cooling for all components of the traction drive system, such as the inverters, traction motors, or the like. The traction alternator/generator may also be coupled to a hydraulic pump 342 which provides hydraulic pressure for use by accessories or other components of the vehicle. That is, in addition to providing electrical power to the traction bus to enable operation of the traction motors to propel the vehicle, the alternator/generator, via power from the engine, provides electrical power to other components such as hydraulic pumps and cooling fans. As will be readily appreciated, therefore, these components require power from the engine, even in a dynamic braking mode of operation, which increases fuel consumption and decreases efficiency of the vehicle, as a whole. At peak retard/dynamic braking effort, on hot days, upwards of 200 horsepower may be needed just to power the auxiliary loads for cooling and hydraulics.

In embodiments, the system may be configured to reclaim dynamic braking energy when in the dynamic braking mode of operation, and to use this reclaimed energy to cancel engine loads (e.g., from the hydraulic pump, control, and motor cooling fan(s), etc.) in order to decrease fuel consumption as compared to existing systems. In particular, as illustrated in FIG. 1, the drive system includes a DC electric motor 344 electrically coupled to the dynamic braking grid and mechanically coupled to the engine. In an embodiment, the motor may be mechanically coupled to the engine through a variable torque type coupling, although a direct mechanical coupling may alternatively be employed. In an embodiment, the coupling may include at least one of a belt, chain, gear, or hydraulic coupling.

The DC motor may therefore be configured to receive DC electrical power from the dynamic braking grid during a dynamic braking mode of operation of the vehicle. In particular, the motor utilizes the DC electrical power from dynamic braking to generate a mechanical output which may be used to help drive and accelerate the engine. In this manner, the motor can be utilized to cancel auxiliary engine loads during a dynamic braking mode of operation, such as cooling fan loads and hydraulic pump loads, thereby decreasing fuel consumption as compared to existing systems which rely solely on the engine to provide auxiliary power.

Figure 4:
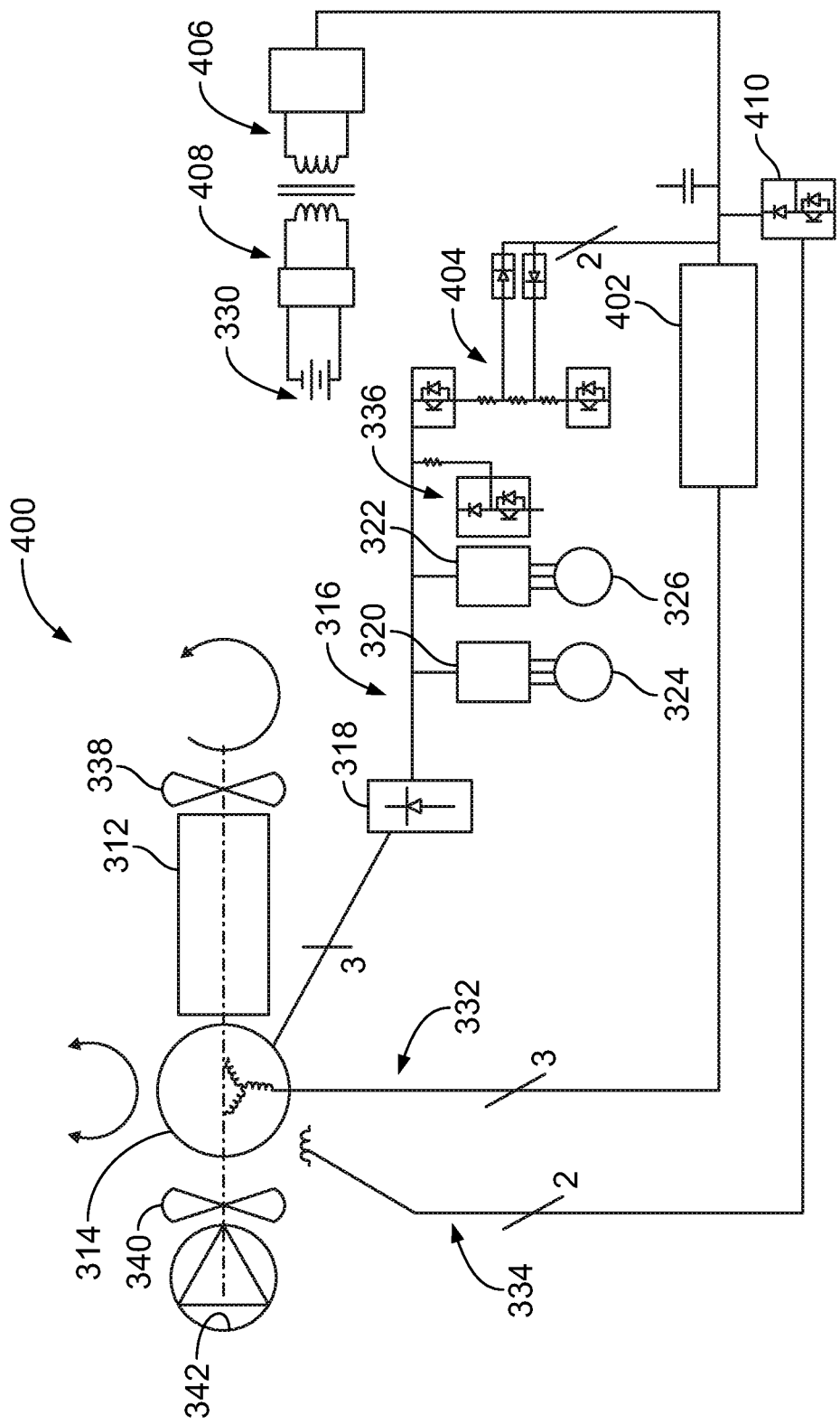
FIG. 4 is a schematic diagram of one example of a drive system.

Referring now to FIG. 4, a drive system 400 for a vehicle according to another embodiment of the present invention is illustrated. The drive system may be generally similar in configuration and manner of operation to the drive system described above in connection with FIG. 3 (e.g., the drive system may be operable in both a propel mode and a dynamic braking mode of operation), where like reference numerals designate like parts. Rather than providing the DC electrical power from the dynamic braking grid to a DC motor connected to the engine to help accelerate the engine to assist with auxiliary engine loads, however, the system 400 may be configured to transfer power generated during dynamic braking from the traction link/bus directly to the alternator/generator to essentially negate auxiliary loads on the engine.

As shown in FIG. 4, the drive system includes a three-phase inverter/rectifier 402 electrically coupled to the dynamic braking grid of the traction link/bus through a power back-feed, double isolated leg 404. The three-phase inverter/rectifier may be, in turn, electrically coupled to the traction alternator/generator. The three-phase inverter/rectifier therefore allows power recovered from dynamic braking to be fed back through the alternator/generator as torque to reduce engine load. In particular, the use of the three-phase inverter/rectifier essentially turns the tertiary winding into a full three-phase machine.

As also illustrated in FIG. 4, the system may further include a primary H-bridge 406 and a secondary, battery side H-bridge 408 that serves to connect a battery to both the dynamic braking grid and the inverter/rectifier. As illustrated, the battery may be electrically coupled to the dynamic braking grid of the traction bus through the power back-feed, double isolated leg. This configuration facilitates the charging the battery utilizing dynamic braking energy when the vehicle may be operating in a dynamic braking mode (i.e., energy flow from the dynamic braking grid to the battery). It also allows power to be transferred from the battery to the alternator (through the inverter/rectifier) to ensure sufficient voltage for cranking the engine during starting. In particular, the charge of the battery can be utilized as a step-up converter for taking the low voltage DC battery up to the voltage required for engine cranking through the alternator low voltage winding. In connection with this, the system may also include a chopper 410 intermediate the inverter/rectifier and the primary H-bridge. The chopper may be utilized for field excitation of the alternator/generator during engine cranking. This configuration therefore obviates the need to utilize a separate starter motor to start the engine.

In an embodiment, each dynamic braking grid may be capable of 1 MW of power, so that an evenly split leg would allow for approximately 300 KW to feed back through the alternator as torque to reduce engine load in retard/dynamic braking mode. The drive system therefore may be capable of providing a number of advantages. First, by applying torque into the alternator, loads on the engine (such as the cooling fan and hydraulic pump) can essentially be negated. In particular, rather than the engine having to supply the full amount of power to meet auxiliary load demands, torque derived from dynamic braking may be utilized to help to drive the alternator to help meet such demands. Accordingly, because the engine may not be solely responsible for driving the alternator, at least during dynamic braking, fuel consumption by the engine may be decreased. In addition to utilizing power generated during dynamic braking to provide a torque into the alternator, power from dynamic braking may be utilized to charge the truck battery, which can then be utilized, in conjunction with the chopper, to crank and start the engine. As discussed above, this obviates the need to employ a separate starter motor to start the engine.

Figure 5:
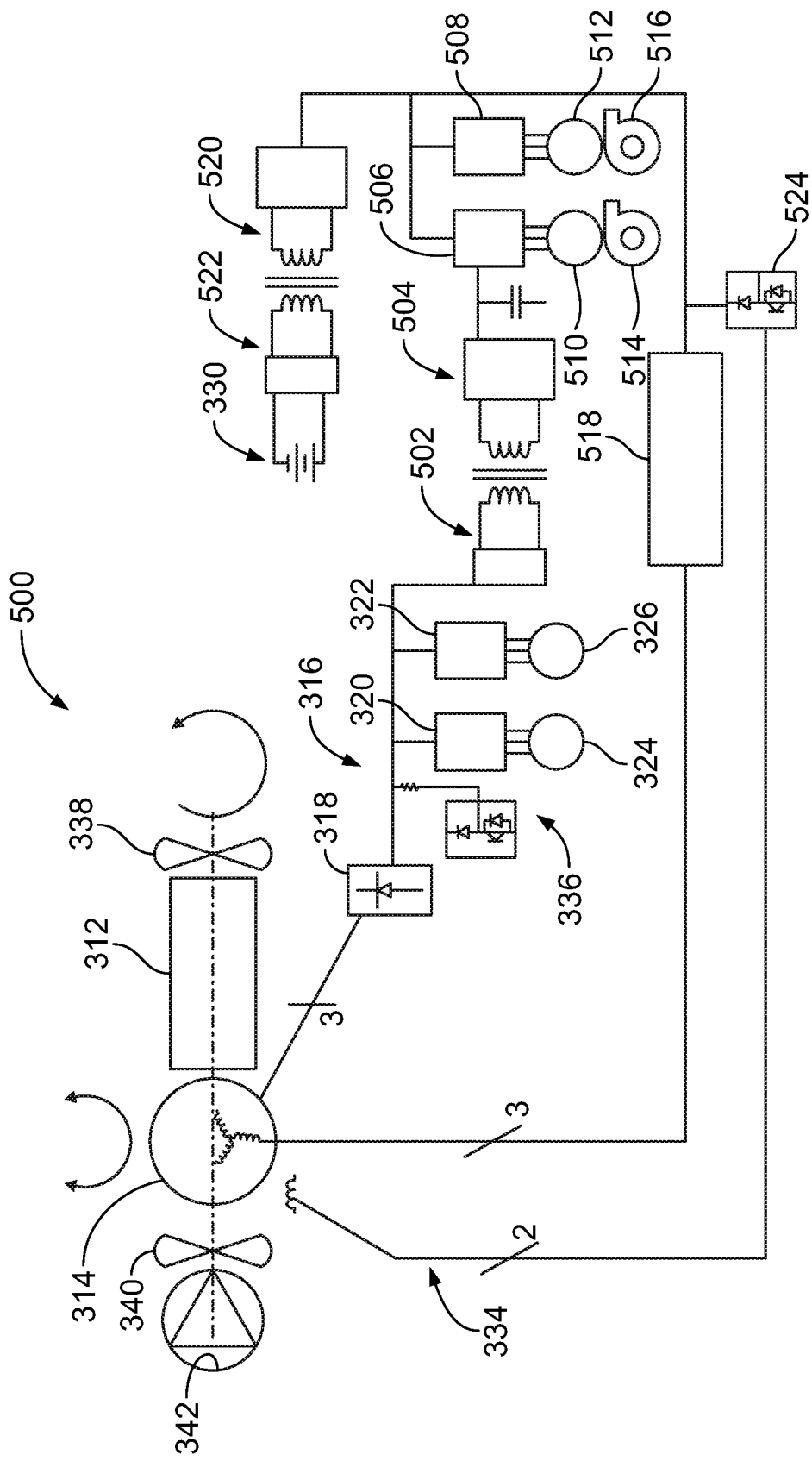
FIG. 5 is a schematic diagram of one example of a drive system.

Turning now to FIG. 5, a drive system 500 for a vehicle according to another embodiment of the present invention is illustrated. The drive system may be generally similar in configuration and manner of operation to the drive system and drive system described above in connection with FIGS. 3 and 4 (i.e., it may be operable in both a propel mode and a dynamic braking mode of operation), where like reference numerals designate like parts.

As shown therein, the drive system includes a primary H-bridge 502 and a secondary H-bridge 504 electrically coupled to the traction bus. The secondary H-bridge may be electrically coupled to a pair of inverters, such as a third inverter 506 and a fourth inverter 508. These inverters may be electrically coupled to third and fourth AC motors 510, 512, respectively, associated with and may be configured to drive first and second blowers 514, 516. In an embodiment, the first blower may be configured to provide cooling for at least one of the inverters and/or the rectifier, and the second blower may be configured to provide cooling for at least one of the motors. This configuration allows energy reclaimed during dynamic braking to pass from the dynamic braking grid, over the H-bridge, to the inverters, where it can be utilized to drive the blowers to provide cooling. Accordingly, rather than the engine having to supply the power to drive the fans/blowers (typically driven through the alternator) for cooling the traction drive system, energy recovered during dynamic braking can be harnessed to drive separate blowers to meet the cooling requirements of the traction drive system. Because the engine is therefore not responsible for providing the energy for powering such cooling system components, a decrease in fuel consumption may be realized (i.e., cooling load cancellation).

The use of inverters and motors to drive separate blowers may also provide additional advantages from a control perspective. In particular, the use of separate blowers driven by motors allows for more precise control of the speed blowers themselves, and thus more precise control of the level of cooling provided. This can lead to increased efficiency when in propel mode. This contrasts with systems which utilize a mechanical coupling between the fan/blower and the engine/alternator, which directly ties the speed of the fan/blower to the speed of the engine.

With further reference to FIG. 5, the system may also include a multi-phase inverter/rectifier 518 (e.g., three phase) electrically coupled to the traction bus (and thus dynamic braking grid) through the H-bridge. The three-phase inverter/rectifier may be, in turn, electrically coupled to the traction alternator. As discussed above in connection with the system of FIG. 4, the inverter/rectifier allows power recovered from dynamic braking to be fed back through the alternator/generator as torque to reduce engine load. Pushing power back into the alternator/generator in this manner achieves a sort of engine load cancellation, as this recovered power can be utilized to drive the alternator/generator (rather than, or in addition to, the engine) to drive cooling fan (where utilized), the hydraulic pump or other auxiliary loads. In this manner, fuel consumption by the engine during dynamic braking may be reduced.

As further illustrated in FIG. 5, the system (like the system of FIG. 4) also includes a primary side battery H-bridge 520 and a secondary, battery side H-bridge 522 that serves to connect a battery to both the traction bus and the inverter/rectifier. This configuration facilitates the charging the battery utilizing dynamic braking energy when the vehicle may be operating in a dynamic braking mode (i.e., energy flow from the dynamic braking grid to the battery). It also allows power to be transferred from the battery to the alternator/generator (through the inverter/rectifier) in order to ensure sufficient voltage for cranking the engine during starting. In particular, the battery charge can be utilized as a step-up converter for taking the low voltage DC battery up to the voltage required for engine cranking through the alternator low voltage winding. In connection with this, the system also may include a chopper 524 configured for field excitation of the alternator/generator during engine cranking. This configuration therefore obviates the need to utilize a separate starter motor to start the engine.

The drive system therefore may be capable of providing a number of advantages. First, by applying torque into the alternator/generator, loads on the engine (such as the hydraulic pump) can essentially be negated. In particular, rather than the engine having to supply the full amount of power to meet auxiliary load demands, torque derived from dynamic braking may be utilized to help to drive the alternator/generator in order to help meet such demands. The use of stand-alone blowers may be powered by dynamic braking energy also takes cooling loads off of the engine. As a result of the above, fuel consumption by the engine may be decreased. In addition to utilizing power generated during dynamic braking to provide a torque into the alternator and for powering stand-alone blowers, power from dynamic braking may be utilized to charge the truck battery, which can then be utilized, in conjunction with the chopper, to crank and start the engine. As discussed above, this obviates the need to employ a separate starter motor to start the engine, resulting in greater efficiency and reduced system cost and complexity, as a whole.

Figure 6:
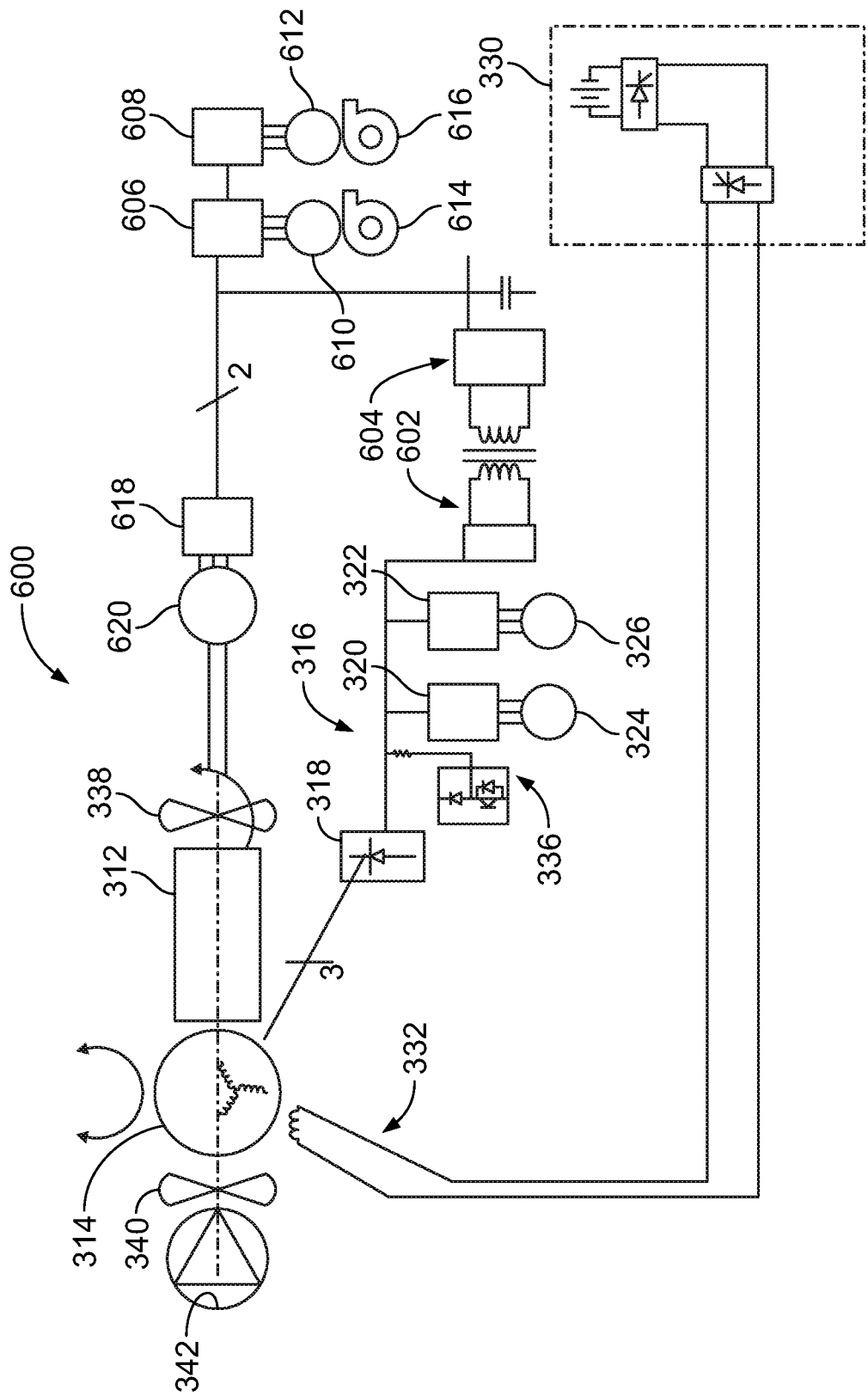
FIG. 6 is a schematic diagram of one example of a drive system.

FIG. 6 illustrates a drive system 600 for a vehicle according to yet another embodiment of the present invention. Like the drive system of FIG. 5, drive system 600 may include a primary H-bridge 602 and a secondary H-bridge 604 electrically coupled to the traction bus 616. The secondary H-bridge may be electrically coupled to a pair of inverters, such as a third inverter 606 and a fourth inverter 608. These inverters may be electrically coupled to third and fourth AC motors 610, 612, respectively, associated with and configured to drive first and second blowers 614, 616. In an embodiment, the first blower may be configured to provide cooling for at least one of the inverters and/or the rectifier, and the second blower may be configured to provide cooling for at least one of the motors, as discussed above. As also discussed above, this configuration allows energy reclaimed during dynamic braking to pass from the dynamic braking grid, over the H-bridge, to the inverters, where it can be utilized to drive the blowers to provide cooling. Accordingly, rather than the engine having to supply the power to drive the fans/blowers (typically driven through the alternator) for cooling the traction drive system, energy recovered during dynamic braking can be harnessed to drive separate blowers to meet the cooling requirements of the traction drive system. Because the engine may be therefore not responsible for providing the energy for powering such cooling system components, a decrease in fuel consumption may be realized.

As discussed previously, the use of inverters and motors to drive separate blowers may also provide additional advantages from a control perspective. In particular, the use of separate blowers driven by AC motors allows for more precise control of the speed blowers themselves, and thus more precise control of the level of cooling provided. This can lead to increased efficiency when in propel mode. This is in contrast to systems which utilize a mechanical coupling between the fan/blower and the engine/alternator, which directly ties the speed of the fan/blower to the speed of the engine.

With further reference to FIG. 6, the system also includes a fifth inverter 618 electrically coupled to the traction bus 316 (and thus dynamic braking grid 336) through the H-bridge and an AC motor 620 electrically connected to the inverter 618. As illustrated, the AC motor 620 may be mechanically coupled to the engine 312. In an embodiment, the coupling may be a direct coupling. In other embodiments, the coupling may be an indirect coupling such as, for example, using a belt drive or the like. In an embodiment, the motor 620 may be a 75 horsepower motor capable of producing approximately 128 lbft of torque at approximately 3900 rpm. In a dynamic braking mode of operation, DC electrical power from the dynamic braking grid 336 may be converted to AC power by the inverter 618, which may be then supplied to the AC motor 620. The AC motor produces a mechanical output which may be used to help drive and accelerate the engine 312. In this manner, the motor 620 can be utilized to cancel auxiliary engine loads during a dynamic braking mode of operation, such as cooling fan loads and hydraulic pump loads, thereby decreasing fuel consumption as compared to existing systems which rely solely on the engine to provide auxiliary power.

As will be readily appreciated, the system 600 may be generally similar to the system 310 discussed above in connection with FIG. 3, however, an inverter 618 and AC motor 620 may be utilized in place of the DC motor. The use of the AC motor instead of a DC motor allows for speed and torque control. In particular, by using an AC motor, the speed and torque input to the engine can be more precisely controlled, in contrast to the system of FIG. 3, which allows for more precise control over how much engine load cancellation may be achieved.

Figure 7:
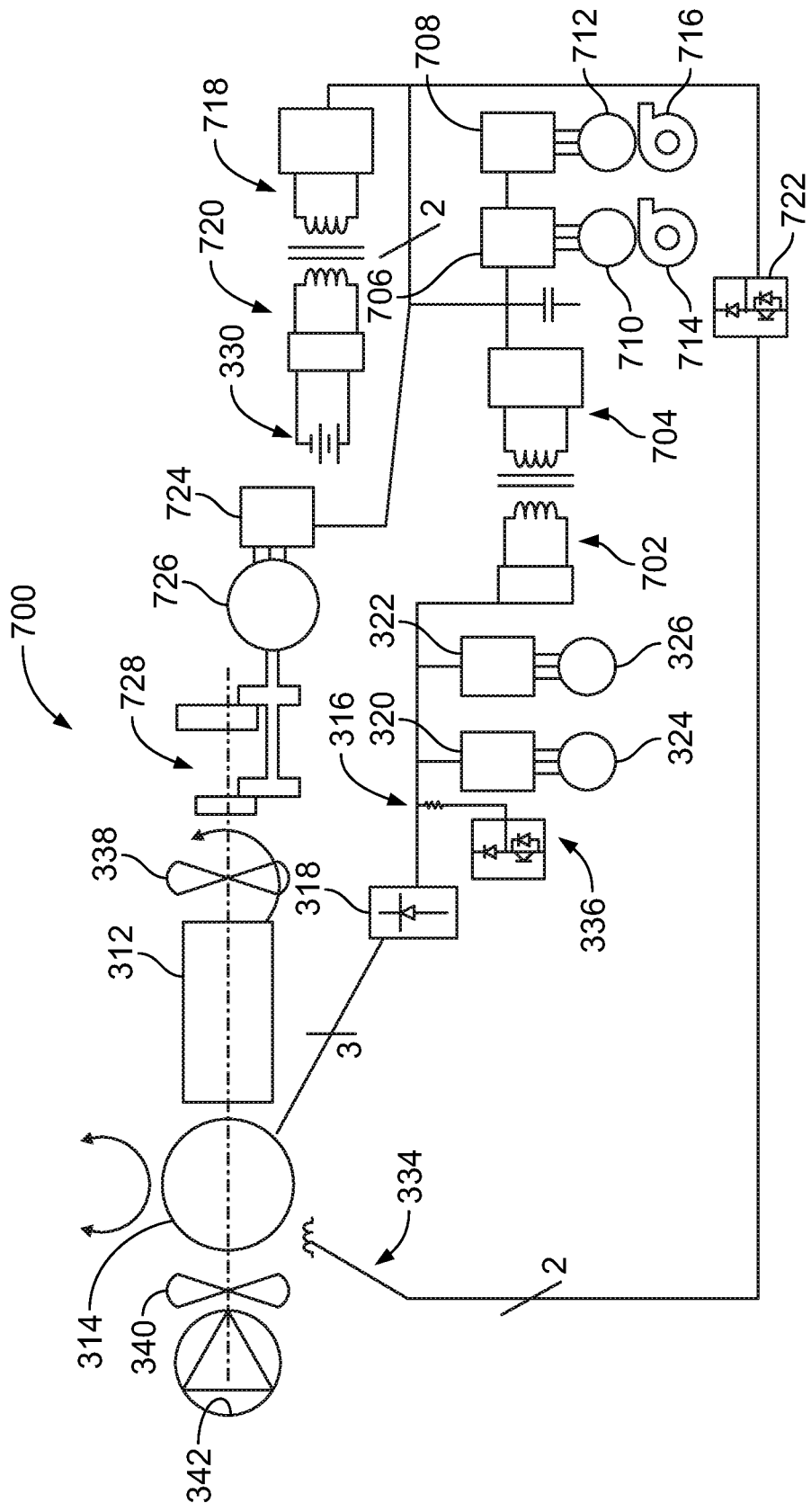
FIG. 7 is a schematic diagram of one example of a drive system.

Referring finally to FIG. 7, a drive system 700 for a vehicle according to yet another embodiment of the present invention is illustrated. The drive system may include a primary H-bridge 702 and a secondary H-bridge 704 electrically coupled to the traction bus. The secondary H-bridge may be electrically coupled to a pair of inverters, such as a third inverter 706 and a fourth inverter 708. These inverters may be electrically coupled to third and fourth motors 710, 712, respectively, associated with and configured to drive first and second blowers 714, 716. In an embodiment, the first blower may be configured to provide cooling for at least one of the inverters and/or the rectifier, and the second blower may be configured to provide cooling for at least one of the motors. As indicated above in connection with the systems of FIGS. 5 and 6, this configuration allows energy reclaimed during dynamic braking to pass from the dynamic braking grid, over the H-bridge, to the inverters, where it can be utilized to drive the blowers to provide cooling. Accordingly, rather than the engine having to supply the power to drive the fans/blowers (typically driven through the alternator) for cooling the traction drive system, energy recovered during dynamic braking can be harnessed to drive separate blowers to meet the cooling requirements of the traction drive system. Because the engine may be therefore not responsible for providing the energy for powering such cooling system components, a decrease in fuel consumption may be realized (i.e., cooling load cancellation).

The use of inverters and AC motors to drive separate blowers also provides additional advantages from a control perspective. In particular, the use of separate blowers driven by AC motors allows for more precise control of the speed blowers themselves, and thus more precise control of the level of cooling provided. This can lead to increased efficiency when in propel mode. This is in contrast to systems which utilize a mechanical coupling between the fan/blower and the engine/alternator, which directly ties the speed of the fan/blower to the speed of the engine.

With further reference to FIG. 7, the system also includes a primary side battery H-bridge 718 and a secondary, battery side H-bridge 720 that serves to connect a battery to the traction bus. This configuration facilitates the charging of the battery utilizing dynamic braking energy when the vehicle may be operating in a dynamic braking mode (i.e., energy flow from the dynamic braking grid to the battery). It also allows power to be transferred from the battery 330 to the alternator/generator to ensure sufficient voltage for cranking the engine during starting. In particular, the battery charge doubles as a step-up converter for taking the low voltage DC battery up to the voltage required for engine cranking through the alternator low voltage winding. In connection with this, the system also includes a chopper 722 intermediate the battery and alternator/generator. The chopper may be configured for field excitation of the alternator/generator during engine cranking. This configuration therefore obviates the need to utilize a separate starter motor to start the engine, thereby decreasing the complexity and increasing the efficiency of the drive system, as a whole. This configuration also obviates the need to employ an alternator field static exciter for field excitation of the alternator/generator.

As further illustrated in FIG. 7, the system also employs an inverter (e.g., fifth inverter 724) and an AC motor 726 that may be configured to help drive and accelerate the engine to decrease engine fuel consumption during dynamic braking. In an embodiment, the motor may be a 75 horsepower motor capable of producing approximately 128 lbft of torque at approximately 3900 rpm. As illustrated, the AC motor may be mechanically coupled to the engine via a clutch 728. In an embodiment, the clutch may include a plurality of gears or belts that allow the motor output to the engine to be precisely controlled. In an embodiment, the clutch may be a dual gear/clutch having a first stage having a gear ratio of approximately 15.625:1 and a second stage having a gear ratio of 1:1. The clutch therefore allows for an input to the engine between 128 lbft of torque at approximately 3125 rpm, and 2000 lbft of torque at approximately 200 rpm.

In operation, dynamic braking energy from the traction bus may be fed to the inverter, where it may be converted to AC power in order to power the motor. The motor converts the AC electrical power into a mechanical output, which may be provided to the engine. As discussed above, the clutch may be operable to selectively vary the speed and torque of the mechanical output of the motor. The AC motor may therefore be utilized to crank the engine during starting, as well as to provide engine load cancellation (for auxiliary engine loads) during retard. Indeed, this configuration enables reliable starting multiple times per hour, so that the engine can be shut down when idling in order to save fuel.

Although not illustrated, the drive systems in each of the embodiments described above include a controller configured to control the traction motor system and the various components thereof, and the electricity supplied to and from the traction motor system.

Figures 8, 9:
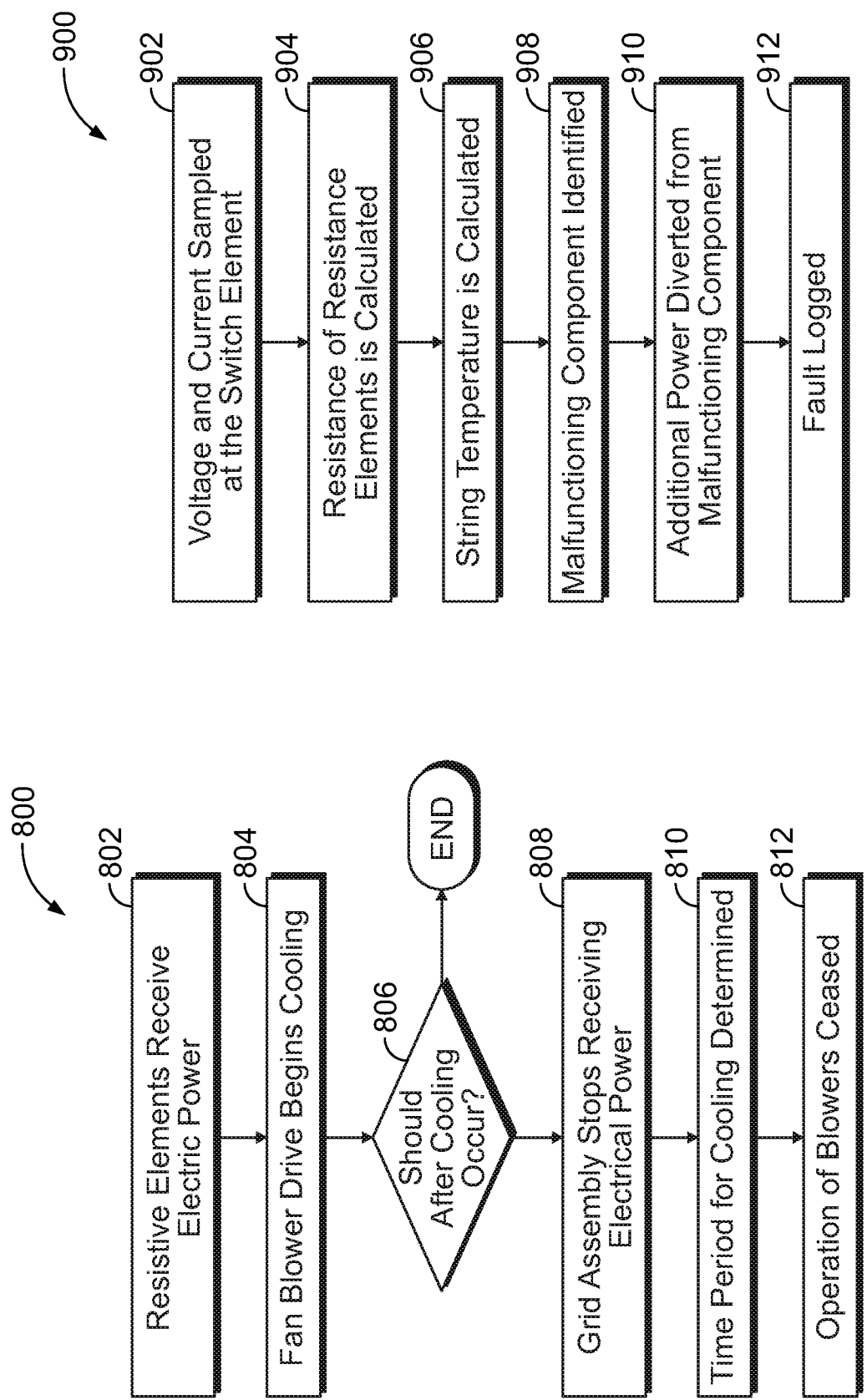
FIG. 8 is a block flow diagram of one example of a method of cooling a grid assembly.
FIG. 9 is a block flow diagram of one example of a method of determining current of a grid assembly.

FIG. 8 illustrates a method 800 of cooling a grid assembly. The grid assembly in one example may be the grid assembly of FIG. 2. At 802, resistive elements of a grid assembly receive electrical power from a system of a vehicle. In one example, during dynamic braking, electrical power may be generated by a traction motor of a locomotive to produce torque that slows the vehicle. In another example, the resistive elements are resistive elements of FIG. 2. In an example, the electrical power may be received from a DC bus that may be electrically coupled to strings of resistive elements.

At 804, in response to the resistive elements of the grid assembly receiving electrical power from a system of a vehicle, at least one fan blower drive may actuate a fan to begin blowing air over resistive elements. In an example, the fan blower drive may be one of blower drives of FIG. 2. In one example, a fan blower drive may be provided for each resistive element string. In another example, the fan blower drive varies its frequency based on the inputted electrical power from the system of the vehicle. In yet another embodiment, the fan blower drive may be an AC based drive. Optionally, one or more processors commands the actuation of the fan blower drive based on the electrical power input. Alternatively, a drive circuit may be provided such that when a threshold input power may be received by a fan blower drive, the drive powers the fan motors. Alternative, in one embodiment, a controller may be configured to determine that electrical power will be sent to the resistive elements and in advance of the electrical power by a defined period the controller initiates at least one fan blower drive so that at least one fan may be operating when the electric power may be received at the resistive elements. Optionally, in one embodiment, the controller may initiate the opening of a louver system to allow or facilitate an airflow across the resistive elements in addition to or in place of initiating a fan blower drive. In this manner, the louver system may cool, or supplement cooling of the resistive elements.

At 806, a determination may be made regarding whether grid cooling should continue after the electrical bus stops providing electrical power to the grid assembly. The cooling performed by the blowers after the electrical bus no longer provides electrical power may be referred to herein as aftercooling. In one example, the one or more processors have a threshold input power where above the threshold input power, grid cooling will continue even after the electrical bus stops providing electrical power to the grid assembly. The threshold input power in one example may be greater than one megawatt (1 Mw). In another example, aftercooling, including the period for aftercooling may be dependent on the type of braking that occurs during operation of a locomotive. In particular, the one or more processors determine if a high retard occurs, a low retard occurs, or a combination thereof, and provides cooling accordingly.

At 808, the grid assembly stops receiving electrical power from the system of the vehicle. In one example, dynamic braking of a vehicle may be no longer required and thus torque no longer needs to be generated to slow the vehicle.

At 810, a period of time may be determined, and blower power for grid cooling continues after the grid assembly stops receiving electrical power (aftercooling). In an example, the cooling may be powered on, or latched on, when an initial threshold power may be reached, and then may be powered off, or latches off when a lower power threshold may be reached. In the example, switch elements are actuated to provide a fixed percent of cooling during the aftercooling period. In one example, each switch element may be one of the switch elements of FIG. 2. In another example, a timer may be provided that sets a determined period based on peak power of the input power into the resistive elements. In one example, the determined period may be 180 seconds. Additionally and alternatively, when lower power levels are inputted into the grid, the determined period may be 30 seconds. Similarly, while in some examples only fan timing may be varied to provide aftercooling, in other embodiments, the speed of a blower may be varied. In one example a peak power may be utilized and maintained. Alternatively and additionally, less than peak power of the blowers may be utilized. The fan speed may be adjusted to minimize power use while still providing desired cooling. Similarly, fan speed along with blower timing may be adjusted not only for energy efficiency purposes, but also to reduce temperature fluctuations associated with the resistive elements and board. Such temperature fluctuations can present additional wear and fatigue above and beyond that caused from heat and heat soaking. In one example, an algorithm may be utilized to determine the most energy efficient manner to cool the resistive elements by varying both after cooling times and blower speed to achieve a desired cooling. To accomplish this, a switch element may be actuated to provide a fixed percent of cooling during the aftercooling period. In one example, the switch may be one of the switches of FIG. 2. Specifically, a ramp rate may be provided for a switch percent to apply a smooth load to the engine. More specifically, each switch provides the reduced amount of power required to keep a blower motor running to prevent detrimental heat soaking from occurring.

At 812, the blowers cease operation based on determined criteria. In one example, power of the vehicle system reduces below a threshold value resulting in the blower drive no longer providing cooling. In another example, the resistive elements are monitored to determine when sufficient cooling has occurred. In one example, the one or more processors utilize a model, or algorithm, based on historical data, resistive element data, power usage data, and/or the like to determine the temperature of the resistive elements. In one example, resistive element data includes the individual temperatures of resistive elements. In other examples, the resistive element data includes the temperature of a string of resistive elements. In yet another example, the resistive element data also includes an average temperature of all of the resistive elements may be determined. While, resistive element data can pertain to all of the resistive elements, the resistive element data can similarly pertain to a portion of the resistive elements. So, if ten strings of resistive elements are presented, with plural resistive elements in each string, resistive element data may be taken only from strings one through five. Alternatively, resistive element data may be taken from strings one, three, four, eight, and ten.

Alternatively, the controller may monitor a current and/or temperature of an energy storage device, or bank. Specifically, in an example, some of the electrical power can be directed to the energy storage device and some to the resistive elements by the controller. The blower can be activated by the controller when electricity may be supplied to the resistive elements, and the blower can be kept active by the controller while a temperature of the energy storage device may be above a threshold temperature regardless of whether the resistive element may be receiving the electrical power to dissipate as heat.

In another example, the resistive elements are monitored utilizing feedback from sensors that provide data to the one or more processors. In one example, the sensor determines the change of resistance over time for resistance elements. Based on this resistance data, temperature of the resistance elements may be determined by an algorithm that calculates the temperature change as a result of resistance change.

In yet another example, the predetermined criteria that causes stoppage of the blowers may be a request to the controller for a high power propel. Specifically, when all power within a vehicle may be required for a different function, such as a high powered propel, the blower drive may cease operation, allowing power to be diverted to power the blowers to be used for the propel system.

In another example, the controller makes determinations and calculations based on thermal life management of the grid assembly. Specifically, the calculated or measured thermal feedback may be monitored in order to limit thermal cycles. Such calculated or measured thermal feedback may include thermal data related to the resistance elements and/or the board. Similarly, the fan power, usage and life are all monitored as well. In particular, in an example, by modulating cooling and/or power dissipation through the grid assembly the life of the grid assembly may be increased. Specifically, thermal cycles are monitored to actively reduce cycles per period of time by modulating cooling timing or speed of each blower in the grid assembly. Specifically, such cycling management of the grid blower may be utilized to enhance fan life and/or grid element life. In one example, methodologies similar to that described in U.S. Pat. Pub. No. 20180141565 entitled Vehicle Control Systems and Methods, and filed on Nov. 23, 2016 are utilized. That disclosure may be incorporated in full herein.

In one example, an algorithm may be utilized to determine how to vary operation of each blower, including timing and power to optimize efficiency and/or mechanical life of the blowers and the grid assembly. Therefore, by varying blower speeds during operation, and even on/off functionality, the mechanical life of each blower and the grid assembly may be increased. Additionally, in one example, all parameter data, include the thermal feedback information of the resistance elements and board, the blower power usage, blower life, or the like, whether calculated or measured, may be transmitted to a remote location, such as a dispatch, so that individuals may monitor changes in cycles, harsh operating conditions, readings indicating potential malfunction, or the like in order to allow the scheduling of preventative maintenance prior to malfunction of a portion of the grid assembly.

Specifically, in one example, a grid assembly memory may be configured to store an accumulated wear parameter values for the grid assembly and an operating age that may be indicative of a duration of use of the grid assembly. In particular, the accumulated wear parameters may include the power and/or speed of operation of the blower drives, changes in operation, environmental conditions during use, environmental condition during non-use, or the like. Similarly, the duration of use of the grid assembly may include operation duration use, duration of time in the field regardless of operational use, or a combination of use and non-use life.

In an example the one or more processors thus obtain the accumulated wear parameter value and the operating age from the grid memory of the grid assembly and update the memory, during operation of the grid assembly, including updating the accumulated wear parameter value. Similarly, the operating age may be advanced during operation of the grid assembly as well.

The one or more processors may then determine, during operation of the grid assembly, an available wear parameter value for the grid assembly based on the accumulated wear parameter value and the operating age and perform corrective actions as a result. In one example a first corrective action may be performed during a first operational period while a second corrective action may be performed during a second operational period.

In one example the active wear parameter value may be determined by monitoring an operating condition of the grid assembly over a plurality of operating ranges. Then, during operation of the grid assembly, a plurality of accumulated wear parameter values may be updated, each of the plurality of accumulated wear parameter values corresponding to a respective operating range of the plurality of operating ranges. Consequently, during operation of the grid assembly, a plurality of available wear parameter values may be determined based on the plurality of accumulated wear parameter values and the operating age, each of the plurality of available wear parameter values corresponding to a respective operating range of the plurality of operating ranges. The first corrective action for the vehicle may be thus performed when at least one of the plurality of available wear parameter values falls below a respective first threshold for the corresponding operating range. Optionally, a projected wear parameter value for each of the plurality of operating ranges based on the advanced operating age and a respective growth rate may be determined, The available wear parameter values for the plurality of operating ranges may be updated based on differences between respective projected wear parameter values and respective accumulated wear parameter values corresponding to the plurality of operating ranges.

FIG. 9 illustrates a method 900 of determining the use of current from a switch element to determine a fault in a blower cooling a leg, or string, of resistive elements. In one example, the grid assembly may be the grid assembly of FIG. 2 and utilized to dissipate heat from dynamic braking of a locomotive motor. Alternatively, the method may be utilized in association with an independent blower utilized to cool other electronic elements in other applications that utilize components with a measurable resistance in association with a switch element.

The methodology in FIG. 9 may be utilized to determine a fault of a blower, because when a blower fails, the temperature of the string being cooled by that blower increases, causing a change in resistance. Thus, changes in current in the switch element indicate the fault has occurred. Once detected, a controller of a grid assembly may take preventative measures such as actuating a switch element to prevent power from being received by the string, or alternatively, shutting down a motor altogether to prevent additional power being inputted into the grid assembly. Specifically, the change of resistance over time based on in-state conditions of voltage and temperature may thus be utilized to determine such loss of cooling as a result of blower malfunction, or otherwise. In this manner, if an individual blower may be malfunctioning, that blower and corresponding string may be restricted to prevent overheating. In one example, after such a blower may be identified as malfunctioning, the one or more processors inputs the fault determination into a fault log for maintenance use.

In one example, the average temperature may be utilized as feedback in determining ceasing of operation of the blowers during aftercooling. In one example, this method may be used at 812 to determine ceasing of operation of the blowers in relation to the method of FIG. 8. Alternatively, the method 900 may be modified and utilized to test resistors within a grid assembly as will be described in relation to FIG. 10 to ensure the specifications provided by manufacturers is accurate, or if such specifications are being misrepresented. Thus, faulty product may be identified and not utilized.

At 902, voltage and on-state grid current may be sampled at the switch element. In one example, a sensor may determine the voltage and/or current at the resistor element. Optionally, the voltage and current sampling occurs during a conduction period when the switching element may be operating. In one example chopper frequencies are used and vary in a range of between 150 to 1000 hz chopping frequencies.

At 904, resistance of the resistance elements may be calculated. Specifically, grid resistors can change 5-10% of overall resistance while heating up to designed element temperature. A high resolution calculation of grid resistance can be provided using synchronously sampled voltage and on state grid current with a grid resistance calculation.

At 906, string temperature may be calculated utilizing the calculated resistance. Specifically, a precise windowing of calculated resistance may be used to calculate grid temperature to use for determining acceptable grid temperature. By measuring the string temperature and specifically changes in such temperature, a faulty component such as a blower can be uncovered.

At 908, a malfunctioning component, such as a blower may be identified. In one example, a change in temperature may be compared to a threshold allowable change in temperature, and if exceeded, indicates a faulty component. Alternatively, the temperature in the string increases without changing other variables, thus indicating a loss in cooling has occurred.

At 910, one or more processors prevent additional power from reaching the faulty string. In one example a switch element may be actuated to prevent additional power from being inputted into the identified string. Alternatively, the motor inputting the power into the grid assembly to be dissipated may be shut down to prevent additional power from being input into the grid assembly. In particular, the controller determines if the remaining strings of resistive elements will be sufficient to dissipate power from a motor without causing additional damage or faults. If the grid assembly may be able to handle the string not working, just the string will be turned off, while if the grid assembly may be unable to handle the string not working, the motor may be shut down.

At 912, a fault may be logged as a result of the increase in temperature. Specifically, if the grid assembly may be able to merely shut down the malfunctioning string, or string with the malfunctioning blower, then a log can be created to indicate maintenance may be required as soon as possible to address the faulty string or blower.

Figure 10:
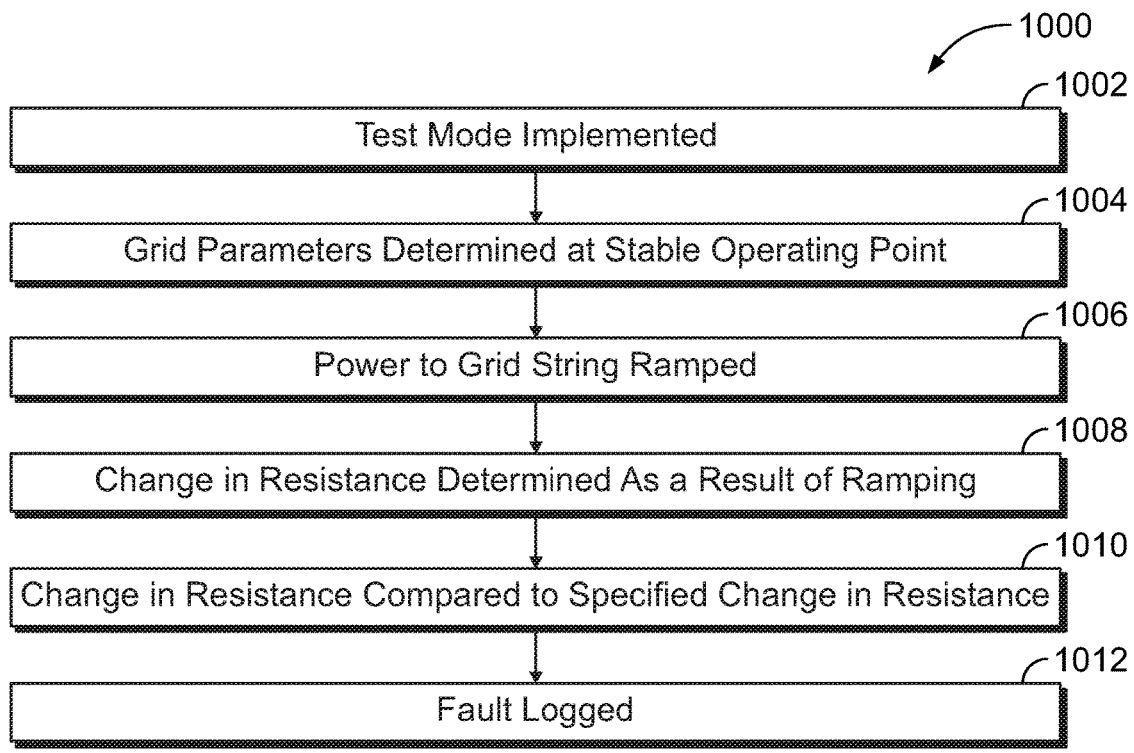
FIG. 10 is a block flow diagram of one example of a method of determining fault in a grid assembly.

The method of FIG. 10 illustrates a method 1000 of determining a fault in a resistive element. At 1002, a test mode may be implemented. In one example, the one or more processors may implement the test mode automatically. In one example, the test mode may be automatically implemented as a result of a determined amount of time being exceeded. Alternatively, the test mode may be implemented as a result of a determined event, such as the first stoppage after a determined amount of mileage may be reached by the vehicle. Optionally, the test mode may be implemented by manual actuation of an individual during a testing session.

At 1004, ambient temperature, atmospheric conditions, and grid resistance at a stable operating point may be monitored and determined. In one example, the grid resistance may be calculated as described in relation to 904 of method 900.

At 1006, after determining the ambient temperature, atmospheric conditions, and grid resistance, a power condition on the grid may be ramped, or varied. In one example, the power may be increased, while in another example the power may be decreased. Similarly, power may be incrementally increased or incrementally decreased.

At 1008, a change of resistance at the switch element during ramping may be determined. Specifically, the determination may be made directly by monitoring the actual resistance. Alternatively, changes in voltage and current are utilized to make the change of resistance determination.

At 1010, the determined change of resistance may be compared to a specified change of resistance based on a specification related to the component. The comparison may be utilized to determine acceptable or unacceptable bounds on resistance following to design.

At 1012, when a fault in a component may be determined at 1010, a fault may be logged. In this manner, countermeasures, such as providing restrictions related to the faulty component during operation, maintenance, replacement, or the like may be utilized to after the fault may be logged. Additionally, extra testing may be undertaken to determine if the increase in resistance may be a result of faulty resistive elements in a string, or as a result of blower malfunctioning resulting in increased temperatures and increased resistance. Either way, needed preventative maintenance can be determined.

Figure 11:
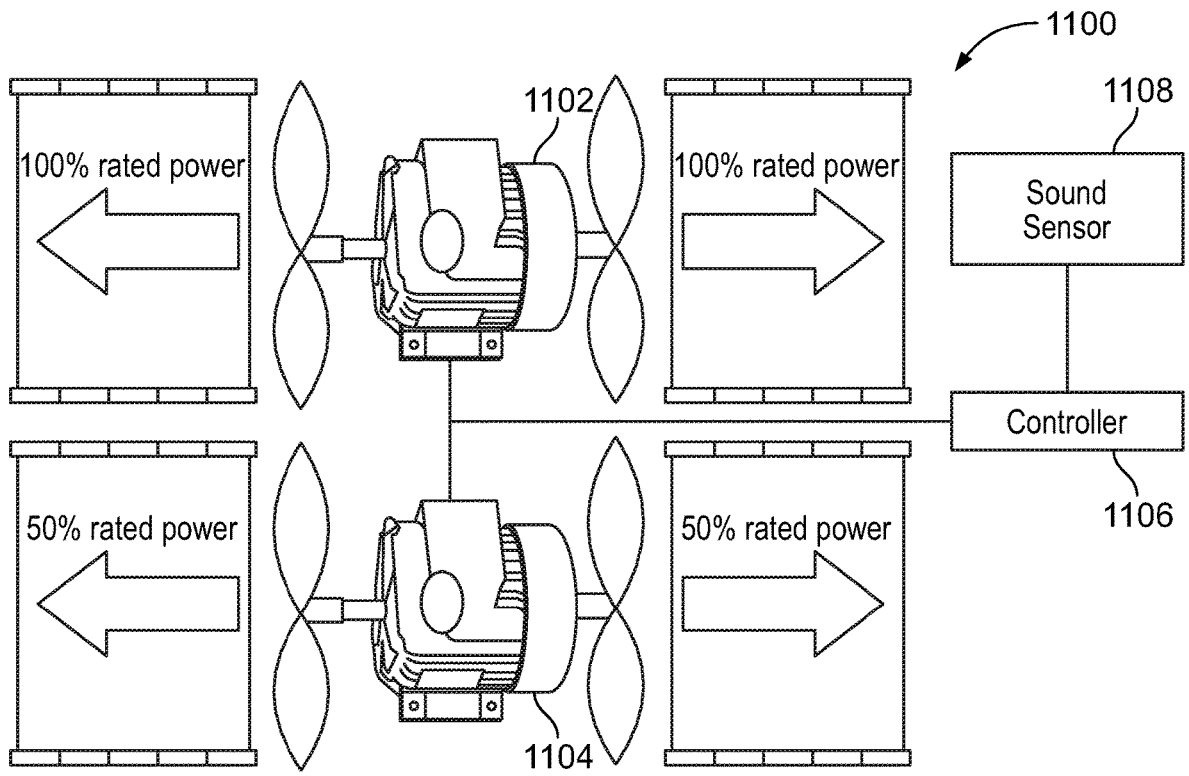
FIG. 11 is a schematic block diagram of one example of a blower assembly.

FIG. 11 illustrates a schematic diagram of a blower assembly 1100 for cooling a grid assembly. In one example, the grid assembly may be grid assembly of FIG. 2 utilizing an AC drive. The blower assembly includes a first grid blower 1102 and a second grid blower 1104 that may be in side by side relation. During initial cooling of the grid assembly the first grid blower may be operated at an inconsistent wavelength as compared to the second grid blower. In one example, the first grid blower may operate at half the wavelength of the second grid blower. Specifically, when grid blowers are utilized to cool air, they are especially noisy at high speed. Additionally, in arrangements when multiple grid blowers are utilized, each fan may operate at the same frequency, resulting in constructive interference and noise to be increased. Consequently, the constructive interference generated by the multiple fans can significantly increase sound in a grid assembly. Meanwhile, by making the blowers off phase, or inconsistent wavelengths, destructive interference occurs, improving sound characteristics.

In one example, a controller 1106 may be operatively coupled to each of the first and second grid blowers to vary the speed of each fan of each blower. In an example, the controller includes one or more processors that executes a flip-flop algorithm to ensure the blowers both provide blowing at different wavelengths yet varies power such that each blower utilizes the same or similar power during a cooling cycle to ensure one blower does not wear more than another during the cooling cycle. Alternatively, the first blower may start at 100% frequency with the second blower at 50% frequency. Then, the second blower may increase up to 100% as additional cooling may be required. While at 100% sound may not be reduced, by starting at 50%, sound reduction may be achieved. Alternatively, an algorithm may be utilized to reduce noise while supplying the cooling required for the grid assembly, and efficiently operating the first and second blowers. In one example, power may be biased to dissipate more power to grid legs, or strings, in higher cooling air path to enable this decreased sound.

In another example a sound sensor 1108 may be coupled to the controller to provide sound data to the controller. In one example, the sound sensor may be a microphone. The controller then utilizes the sound data to vary the operation of each blower to reduce sound. In one example, when a determined amount of cooling may be desired, the controller will not adjust the first or second blowers, and instead with prioritized cooling over sound reduction. In other examples, sound reduction may be provided with priority.

Thus, provided are grid assemblies and accompanying cooling systems of grid assemblies that include blower systems. A controller operates the blower system even after electric power may not be conveyed to resistive element of the grid assembly. In this manner, additional cooling may be provided that reduces wear on the resistive elements and substrate, or board the resistive elements are disposed. Thus, the life of the board and resistive elements are enhanced. To this end, the controller may be able to vary speeds of the blowers even after power is no longer conveyed to the resistive elements. This allows for controlled cooling, including ensuring minimal temperature fluctuations, or other conditions are not presented that cause additional wear and fatigue within the grid assembly. Thus, improved cooling and an improved grid assembly may be provided.

In an example embodiment, an assembly may be provided that may include a controller configured to be coupled with at least one blower drive that operates a blower motor to cool resistive elements that dissipate electrical power as heat. The controller may also be configured to determine whether the electrical power is no longer received by the resistive elements and operate the at least one blower drive to operate the blower motor to cool the resistive elements responsive to the electrical power no longer being received by the resistive elements.

Optionally, the controller may be configured to control the at least one blower drive to activate the blower motor to cool the resistive elements for a defined time period after determining that the electrical power is not received by the resistive elements and to deactivate the blower motor after expiration of the defined time period.

Optionally, the controller may be configured to determine a temperature of the resistive elements, and to control the at least one blower drive to deactivate the blower motor responsive to the temperature of the resistive elements not exceeding a threshold temperature. In one aspect the controller may be configured to determine the temperature of the resistive elements by determining a change in resistance of one or more of the resistive elements. Alternatively, the controller may be configured to change a speed of the blower motor responsive to the temperature of the resistive elements determined.

Optionally, the controller may be configured to change a speed of the blower motor responsive to the electrical power no longer being received by the resistive elements.

Optionally, the at least one blower drive may include a first blower drive and a second blower drive, and the controller may be configured to independently vary speed of the first blower drive and speed of the second blower drive after the electrical power is no longer received by the resistive elements.

In one or more embodiments, a method may be provided that may include receiving electrical power from an electrical bus at resistive elements of a grid assembly and operating a blower drive while receiving the electrical power at the resistive elements from the electrical bus. The method may also include operating the blower drive after the electrical power is no longer received by the resistive elements to cool the resistive elements, and ceasing operation of the blower drive after the electrical power is no longer received by the resistive elements.

Optionally, ceasing the operation of the blower drive may include receiving parameter data related to the electrical power received by the resistive elements from the electrical bus; determining a determined operating period to operate the blower drive after the electrical power is no longer received by the resistive elements based on a model; and ceasing the operation of the blower drive after the determined operating period.

Optionally, ceasing the operation of the blower drive may include receiving parameter data related to the resistive elements; determining an average temperature of the resistive elements based on the parameter data; and ceasing the operation of the blower drive when the average temperature of the resistive elements is below a threshold temperature. In one aspect, determining the average temperature of the resistive elements based on the parameter data may include calculating a change in resistance of the resistive elements based on at least one of current data or voltage data.

In one or more embodiments, a system may be provided that may include a controller configured to determine an accumulated wear parameter value for a grid assembly of a vehicle and an operating age indicative of a duration of use of the grid assembly. The controller may be configured to update the accumulated wear parameter value based on operation of the grid assembly and determine an available wear parameter value for the grid assembly based on the accumulated wear parameter value and the operating age. The controller may also be configured to perform a first responsive action based on at least the available wear parameter value.

Optionally, the controller may also be configured to monitor an operating condition of the grid assembly over a plurality of operating ranges, update, during the operation of the grid assembly, a plurality of the accumulated wear parameter values. Each of the plurality of accumulated wear parameter values may correspond to a respective operating range of the plurality of operating ranges. The controller may also be configured to determine, during the operation of the grid assembly, a plurality of available wear parameter values based on the plurality of accumulated wear parameter values and the operating age, each of the plurality of available wear parameter values corresponding to the respective operating range of the plurality of operating ranges. A first corrective action for the vehicle may be performed when at least one of the plurality of available wear parameter values falls below a respective first threshold for the respective operating range of the plurality of operating ranges.

Optionally, the controller may also be configured to determine a projected wear parameter value for each of the plurality of operating ranges based on the operating age advanced and a respective growth rate and update the available wear parameter values for the plurality of operating ranges based on differences between respective projected wear parameter values and respective accumulated wear parameter values corresponding to the plurality of operating ranges.

Optionally, the grid assembly may include resistive elements and the available wear parameter value may be related to the resistive elements of the grid assembly, and the grid assembly may include at least one blower drive. The available wear parameter value may be related to the at least one blower drive.

Optionally, the available wear parameter value of the grid assembly may be an average temperature of resistive elements of the grid assembly; and responsive to the average temperature of resistive elements of the grid assembly increasing above a change in temperature threshold, performing a first corrective action of varying a blower drive of the grid assembly.

Optionally, the grid assembly of the vehicle may also include a first blower drive electrically coupled to an electrical bus and resistive elements of the grid assembly to operate a first blower motor responsive to electrical power received by the resistive elements from the electrical bus, and a second blower drive electrically coupled to the electrical bus and the resistive elements to operate a second blower motor responsive to the electrical power received by the resistive elements from the electrical bus. Optionally, the controller may be configured to monitor a sound output from the first blower drive and the second blower drive and vary at least one of a first frequency or a second frequency based on the sound output.

Optionally, the controller may be configured to provide an initial first frequency of the first blower drive and an initial second frequency of the second blower drive; and to vary the initial second frequency without varying the initial first frequency.

Optionally, the controller may be configured to monitor available wear parameters of the first blower drive and the second blower drive and vary an operation of the first blower drive or an operation of the second blower drive based on the available wear parameters of the first blower drive and the second blower drive monitored, and a flip flop algorithm.

In an example embodiment, a grid assembly of a rail vehicle may be provided that can include an electrical bus configured to receive electrical power from a power system within the rail vehicle and resistive elements disposed on a substrate and coupled to the electrical bus to receive the electrical power from the power system within the rail vehicle and dissipate the electrical power as heat. At least one blower drive may be electrically coupled to the electrical bus and the resistive elements to operate a blower motor responsive to the electrical power received by the resistive elements from the electrical bus. A controller can be operably coupled to the blower drive and electrically coupled to the electric bus and resistive elements and may include one or more processors configured to execute instructions to determine when electrical power may be no longer received by the resistive elements from the electrical bus and operate the at least one blower drive to operate the blower motor after the electrical power is no longer received by the resistive elements.

Optionally, the one or more processors may be further configured to cease operation of the blower drive after the electrical power is no longer received by the resistive elements.

In one example, ceasing operation of the blower drive includes receiving parameter data related to the electric power received by the resistive elements from the electric bus, and determining a predetermined operating period to operate the blower drive after the electrical power is no longer received by the resistive element based on a model. The ceasing of operation of the blower drive can also include ceasing operation of the blower drive after the predetermined operating period.

In another aspect, ceasing operation of the blower drive includes receiving parameter data related to the resistive elements, determining an average temperature of the resistive elements based on the parameter data, and ceasing operation of the blower drive when the average temperature of the resistive elements may be below a threshold temperature. Optionally, the parameter data includes at least one of current data or voltage data. In another example, determining the average temperature of the resistive elements based on the parameter data includes calculating a change in resistance of the resistive elements based on at least one of the current data or voltage data. Optionally, the average temperature of the resistive elements may be calculated based on the calculated change in resistance of the resistive elements.

In one aspect, ceasing operation of the blower drive comprises providing a predetermined period of time after determining when electrical power is no longer received by the resistive elements from the electrical bus; and ceasing operation of the blower drive when the predetermined period of time expires. Optionally, the one or more processors may be further configured to independently vary speed of each blower when operating each blower after the electrical power is no longer received by the resistive elements from the electrical bus.

In another aspect, ceasing operation of the blower drive includes receiving a signal at the controller to divert power from the blower motor to a traction motor of the rail vehicle. Optionally, the grid assembly also includes a motor of a locomotive that supplies the electric power to the electric bus in response to dynamic braking of the motor.

In one example, a method of cooling a grid assembly may be provided that includes receiving electrical power from an electrical bus at resistive elements of the grid assembly and operating a blower drive while receiving the electrical power at the resistive elements from the electrical bus. The method also includes operating the blower drive after the electrical power is no longer received by the resistive elements to cool the resistive elements, and ceasing operation of the blower drive after the electrical power is no longer received by the resistive elements.

Optionally, the method also includes ceasing operation of the blower drive includes receiving parameter data related to the electric power received by the resistive elements from the electric bus, and determining a predetermined operating period to operate the blower drive after the electrical power is no longer received by the resistive element based on a model; and ceasing operation of the blower drive after the predetermined operating period.

In one aspect, ceasing operation of the blower drive includes receiving parameter data related to the resistive elements; determining an average temperature of the resistive elements based on the parameter data, and ceasing operation of the blower drive when the average temperature of the resistive elements may be below a threshold temperature. Optionally, determining the average temperature of the resistive elements based on the parameter data includes calculating a change in resistance of the resistive elements based on at least one of the current data or voltage data.

As used herein, the terms "processor" and "computer," and related terms, e.g., "processing device," "computing device," and "controller" may be not limited to just those integrated circuits referred to in the art as a computer, but refer to a microcontroller, a microcomputer, a programmable logic controller (PLC), field programmable gate array, and application specific integrated circuit, and other programmable circuits. Suitable memory may include, for example, a computer-readable medium. A computer-readable medium may be, for example, a random-access memory (RAM), a computer-readable non-volatile medium, such as a flash memory. The term "non-transitory computer-readable media" represents a tangible computer-based device implemented for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. As such, the term includes tangible, computer-readable media, including, without limitation, non-transitory computer storage devices, including without limitation, volatile and non-volatile media, and removable and non-removable media such as firmware, physical and virtual storage, CD-ROMS, DVDs, and other digital sources, such as a network or the Internet.

The singular forms "a", "an", and "the" include plural references unless the context clearly dictates otherwise. "Optional" or "optionally" means that the subsequently described event or circumstance may or may not occur, and that the description may include instances where the event occurs and instances where it does not. Approximating language, as used herein throughout the specification and claims, may be applied to modify any quantitative representation that could permissibly vary without resulting in a change in the basic function to which it may be related. Accordingly, a value modified by a term or terms, such as "about," "substantially," and "approximately," may be not to be limited to the precise value specified. In at least some instances, the approximating language may correspond to the precision of an instrument for measuring the value. Here and throughout the specification and claims, range limitations may be combined and/or interchanged, such ranges may be identified and include all the sub-ranges contained therein unless context or language indicates otherwise.

This written description uses examples to disclose the embodiments, including the best mode, and to enable a person of ordinary skill in the art to practice the embodiments, including making and using any devices or systems and performing any incorporated methods. The claims define the patentable scope of the disclosure, and include other examples that occur to those of ordinary skill in the art. Such other examples are intended to be within the scope of the claims if they have structural elements that do not differ from the literal language of the claims, or if they include equivalent structural elements with insubstantial differences from the literal language of the claims.

What is claimed is:

1. An assembly comprising:
a controller configured to be coupled with at least one blower drive that operates a blower motor to cool resistive elements that dissipate electrical power as heat, the controller configured to determine whether the electrical power is no longer received by the resistive elements and control the at least one blower drive to operate the blower motor to cool the resistive elements responsive to the electrical power no longer being received by the resistive elements.

2. The assembly of claim 1, wherein the controller is configured to control the at least one blower drive to activate the blower motor to cool the resistive elements for a defined time period after determining that the electrical power is not received by the resistive elements and to deactivate the blower motor after expiration of the defined time period.

3. The assembly of claim 1, wherein the controller is configured to determine a temperature of the resistive elements, and to control the at least one blower drive to deactivate the blower motor responsive to the temperature of the resistive elements not exceeding a threshold temperature.

4. The assembly of claim 3, wherein the controller is configured to calculate the temperature of the resistive elements by determining a change in resistance of one or more of the resistive elements.

5. The assembly of claim 3, wherein the controller is configured to change a speed of the blower motor based on the temperature of the resistive elements that is determined.

6. The assembly of claim 1, wherein the controller is configured to change a speed at which the blower motor operates responsive to the electrical power no longer being received by the resistive elements.

7. The assembly of claim 1, wherein the at least one blower drive includes a first blower drive and a second blower drive, and the controller is configured to independently vary speed of the first blower drive and speed of the second blower drive after the electrical power is no longer received by the resistive elements.

8. A method comprising:
receiving electrical power from an electrical bus at resistive elements of a grid assembly;
cooling the resistive elements by operating a blower drive while receiving the electrical power at the resistive elements from the electrical bus;
continuing to cool the resistive elements by continuing to operate the blower drive after the electrical power is no longer received by the resistive elements for a period of time, the period of time during which the blower drive continues to operate after the electrical power is no longer received by the resistive elements based on one or more operational parameters of the grid assembly; and
ceasing operation of the blower drive after the electrical power is no longer received by the resistive elements for longer than the period of time.

9. The method of claim 8, wherein ceasing the operation of the blower drive includes receiving parameter data related to the electrical power received by the resistive elements from the electrical bus and indicative of the one or more operational parameters; and determining the period of time to operate the blower drive after the electrical power is no longer received by the resistive elements based on a model and the one or more operational parameters.

10. The method of claim 8, wherein ceasing the operation of the blower drive includes receiving parameter data related to the resistive elements and indicative of the one or more operational parameters; determining an average temperature of the resistive elements based on the one or more operational parameters; and ceasing the operation of the blower drive responsive to the average temperature of the resistive elements being cooler than a threshold temperature.

11. The method of claim 10, wherein determining the average temperature of the resistive elements based on the one or more operational parameters includes calculating a change in resistance of the resistive elements based on at least one of current data or voltage data.

12. A system, comprising:
a controller configured to determine an accumulated wear parameter value for a grid assembly of a vehicle and an operating age indicative of a duration of use of the grid assembly, the controller configured to update the accumulated wear parameter value based on operation of the grid assembly and determine an available wear parameter value for the grid assembly based on the accumulated wear parameter value and the operating age, the controller configured to perform a first responsive action based on at least the available wear parameter value.

13. The system of claim 12, wherein the controller is configured to
monitor an operating condition of the grid assembly over a plurality of operating ranges;
update, during the operation of the grid assembly, a plurality of the accumulated wear parameter values, each of the plurality of accumulated wear parameter values corresponding to a respective operating range of the plurality of operating ranges; and
determine, during the operation of the grid assembly, a plurality of available wear parameter values based on the plurality of accumulated wear parameter values and the operating age, each of the plurality of available wear parameter values corresponding to the respective operating range of the plurality of operating ranges, wherein a first corrective action for the vehicle is performed when at least one of the plurality of available wear parameter values falls below a respective first threshold for the respective operating range of the plurality of operating ranges.

14. The system of claim 13, wherein the controller is configured to:
determine a projected wear parameter value for each of the plurality of operating ranges based on the operating age advanced and a respective growth rate; and
update the available wear parameter values for the plurality of operating ranges based on differences between respective projected wear parameter values and respective accumulated wear parameter values corresponding to the plurality of operating ranges.

15. The system of claim 14, wherein the grid assembly includes resistive elements and the available wear parameter value is related to the resistive elements of the grid assembly; and wherein the grid assembly includes at least one blower drive, and the available wear parameter value is related to the at least one blower drive.

16. The system of claim 12, wherein the available wear parameter value of the grid assembly is an average temperature of resistive elements of the grid assembly; and responsive to the average temperature of resistive elements of the grid assembly increasing above a change in temperature threshold, performing a first corrective action of varying a blower drive of the grid assembly.

17. The system of claim 12, wherein the grid assembly of the vehicle further comprises:
   a first blower drive electrically coupled to an electrical bus and resistive elements of the grid assembly to operate a first blower motor responsive to electrical power received by the resistive elements from the electrical bus; and
   a second blower drive electrically coupled to the electrical bus and the resistive elements to operate a second blower motor responsive to the electrical power received by the resistive elements from the electrical bus.

18. The system of claim 17, wherein the controller is configured to monitor a sound output from the first blower drive and the second blower drive; and vary at least one of a first frequency or a second frequency based on the sound output.

19. The system of claim 17, wherein the controller is configured to provide an initial first frequency of the first blower drive and an initial second frequency of the second blower drive; and to vary the initial second frequency without varying the initial first frequency.

20. The system of claim 17, wherein the controller is configured to monitor available wear parameters of the first blower drive and the second blower drive, and vary an operation of the first blower drive or an operation of the second blower drive based on the available wear parameters of the first blower drive and the second blower drive monitored, and a flip flop algorithm.

* * * * *